United States Patent
Nawata et al.

(10) Patent No.: US 8,873,292 B2
(45) Date of Patent: Oct. 28, 2014

(54) NONVOLATILE SEMICONDUCTOR MEMORY DEVICE

(75) Inventors: Hidefumi Nawata, Kawasaki (JP); Kiyomi Naruke, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 382 days.

(21) Appl. No.: 13/424,741

(22) Filed: Mar. 20, 2012

(65) Prior Publication Data

US 2013/0077404 A1    Mar. 28, 2013

(30) Foreign Application Priority Data

Sep. 26, 2011 (JP) ................................. 2011-208725

(51) Int. Cl.
*G11C 11/34* (2006.01)
*G11C 16/10* (2006.01)
*G11C 16/34* (2006.01)

(52) U.S. Cl.
CPC ............ *G11C 16/10* (2013.01); *G11C 16/3418* (2013.01); *G11C 16/3454* (2013.01)
USPC ............ 365/185.17; 365/185.21; 365/185.22; 365/185.19; 365/185.03

(58) Field of Classification Search
USPC ............. 365/185.17, 185.21, 185.22, 185.19, 365/185.03
See application file for complete search history.

(56) References Cited

U.S. PATENT DOCUMENTS

| | | | | |
|---|---|---|---|---|
| 2008/0316818 | A1* | 12/2008 | Park et al. | 365/185.03 |
| 2010/0008136 | A1* | 1/2010 | Seol et al. | 365/185.2 |
| 2012/0075931 | A1* | 3/2012 | Yuh | 365/185.17 |

FOREIGN PATENT DOCUMENTS

| | | |
|---|---|---|
| JP | 2009-539203 | 11/2009 |
| WO | WO 2007/143398 A2 | 12/2007 |

* cited by examiner

*Primary Examiner* — Han Yang
(74) *Attorney, Agent, or Firm* — Oblon, Spivak, McClelland, Maier & Neustadt, L.L.P.

(57) ABSTRACT

A nonvolatile semiconductor memory device according to one embodiment includes: memory cells; word lines connected to the memory cells; and a control circuit configured to control a data read operation. When controlling the data read operation, the control circuit applies one of read voltages to a selected word line, applies a first read pass voltage to a first non-selected word line connected to one of data-written memory cells, and applies a second read pass voltage to a second non-selected word line connected to a non-written memory cell. Each of the read voltages is set to a voltage between two threshold voltage distributions. The first read pass voltage is set so that the data-written memory cells become conductive. The second read pass voltage is set so as to be lower than a highest read voltage, the highest read voltage being the highest voltage among the read voltages.

20 Claims, 11 Drawing Sheets

READ OPERATION (Vth=VA,VB or VC)

Vth(min) ≦ Vread2 < Vth(max) ≦ Vread3 ≦ Vread1

READ OPERATION (Vth=VA,VB or VC)

$Vth(min) \leq Vread2 < Vth(max) \leq Vread1$

READ OPERATION (Vth=VA, VB or VC)

$Vread2 \leq Vvfy(min) < Vvfy(max) \leq Vread1$

WRITE VERIFY OPERATION (Vvfy=VAV,VBV, or VCV)

$Vread2 \leq Vvfy(min) < Vvfy(max) \leq Vread3 \leq Vread1$

WRITE VERIFY OPERATION (Vvfy=VAV,VBV or VCV)

$Vread2 \leq Vvfy(min) < Vvfy(max) \leq Vread3' \leq Vread3 \leq Vread1$

WRITE VERIFY OPERATION (Vvfy=VAV,VBV or VCV)

$Vread3(R) + Vread1(R) < Vread3(V) + Vread1(V)$

NONVOLATILE SEMICONDUCTOR MEMORY DEVICE

CROSS REFERENCE TO RELATED APPLICATION

This application is based upon and claims the benefit of priority from prior Japanese Patent Application No. 2011-208725, filed on Sep. 26, 2011, the entire contents of which are incorporated herein by reference.

BACKGROUND

1. Field

Embodiments described herein relate generally to a nonvolatile semiconductor memory device.

2. Description of the Related Art

There is a rapidly increasing demand for a NAND flash memory with an increase in a use of large-capacity data such as images or moving pictures in mobile apparatuses or the like. In particular, the use of a multi-value storage technique capable of storing information of two bits or more in one memory cell enables a large amount of information to be stored in a small chip area.

In highly integrated flash memories where memory cells are further miniaturized, when reading memory cells in which a data write operation is finished, a read pass voltage applied to non-selected memory cells affects a threshold voltage representing the data of a non-selected memory cell. This influence appears as change in a threshold voltage distribution. In particular, when a multi-value storage scheme is employed, the width of the threshold voltage distribution and interval between the threshold voltage distributions are set to be narrower than those in a 2-value storage scheme. Thus, the change in the threshold voltage distribution has a significant influence on the reliability of data. Therefore, it is necessary to execute a read operation capable of suppressing the change in the threshold voltage of a non-selected memory cell caused by a read pass voltage.

DETAILED DESCRIPTION

A nonvolatile semiconductor memory device according to one embodiment includes: a plurality of memory cells configured to hold a threshold voltage included in any one of a plurality of threshold voltage distributions; a memory cell array having NAND cell units arranged therein, each of the NAND cell units including a memory string in which the memory cells are connected in series and select transistors connected to both ends of the memory string, respectively; word lines connected to the memory cells; bit lines connected to a first end of each of the NAND cell units; a source line connected to second ends of the NAND cell units; and a control circuit configured to control a data read operation. When controlling the data read operation, the control circuit applies one of read voltages to a selected word line connected to a selected memory cell, applies a first read pass voltage to a first non-selected word line connected to one of data-written memory cells, and applies a second read pass voltage to a second non-selected word line connected to a non-written memory cell. Each of the read voltages is set to a voltage between two adjacent threshold voltage distributions. The first read pass voltage is set so that the data-written memory cells become conductive regardless of the kind of the plurality of threshold voltage distributions formed by the data-written memory cells. The second read pass voltage is set so as to be lower than a highest read voltage, the highest read voltage being the highest voltage among the read voltages.

A nonvolatile semiconductor memory device according to embodiments of the present invention will be described with reference to the drawings.

First Embodiment

Configuration

Figure 1:
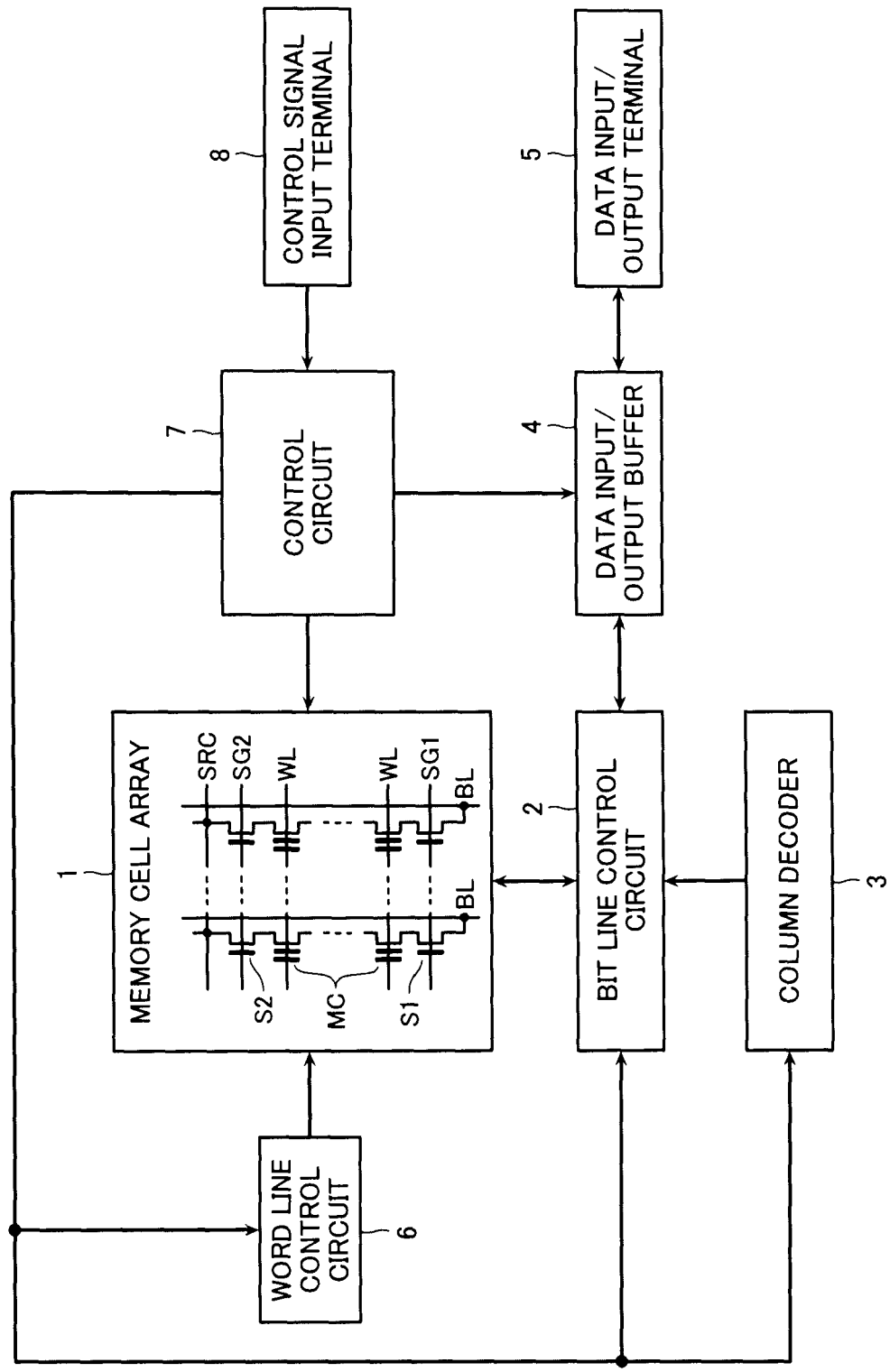
FIG. 1 is a block diagram illustrating a schematic configuration of a nonvolatile semiconductor memory device according to an embodiment.

FIG. 1 illustrates a schematic configuration of a nonvolatile semiconductor memory device according to a first embodiment. The nonvolatile semiconductor memory device is a NAND flash memory employing a 4-value storage scheme. The nonvolatile semiconductor memory device includes a memory cell array 1 in which memory cells MC for storing data are disposed in a matrix form. The memory cell array 1 includes a plurality of bit lines BL, a plurality of word lines WL, a source line SRC, and a plurality of memory cells MC. The memory cell MC has a stacked gate structure including a floating gate electrode as a charge accumulation layer for storing charges and a control gate electrode connected to the word line WL. The memory cell MC is configured to electrically rewrite data by injecting or discharging charges to or from the floating gate electrode. The memory cells MC are disposed in a matrix form at respective intersections of the bit lines BL and the word lines WL.

A bit line control circuit 2 configured to control the voltage of the bit line BL and a word line control circuit 6 configured to control the voltage of the word line WL are connected to the memory cell array 1. The bit line control circuit 2 reads the data of a memory cell MC in the memory cell array 1 through the bit line BL. Moreover, the bit line control circuit 2 applies a control voltage to the memory cell MC in the memory cell array 1 through the bit line BL to thereby write data to the memory cell MC.

A column decoder 3 and a data input/output buffer 4 are connected to the bit line control circuit 2. The data of the memory cell MC read from the memory cell array 1 are output to the outside from a data input/output terminal 5 through the data input/output buffer 4. Moreover, the write data input from the outside to the data input/output terminal 5 are input to the bit line control circuit 2 through the data input/output buffer 4 and are written to a designated memory cell MC.

Moreover, the memory cell array 1, the bit line control circuit 2, the column decoder 3, the data input/output buffer 4, and the word line control circuit 6 are connected to a control circuit 7. The control circuit 7 generates a control signal for controlling the memory cell array 1, the bit line control circuit 2, the column decoder 3, the data input/output buffer 4, and the word line control circuit 6 in accordance with a control signal input to a control signal input terminal 8.

Figure 2:
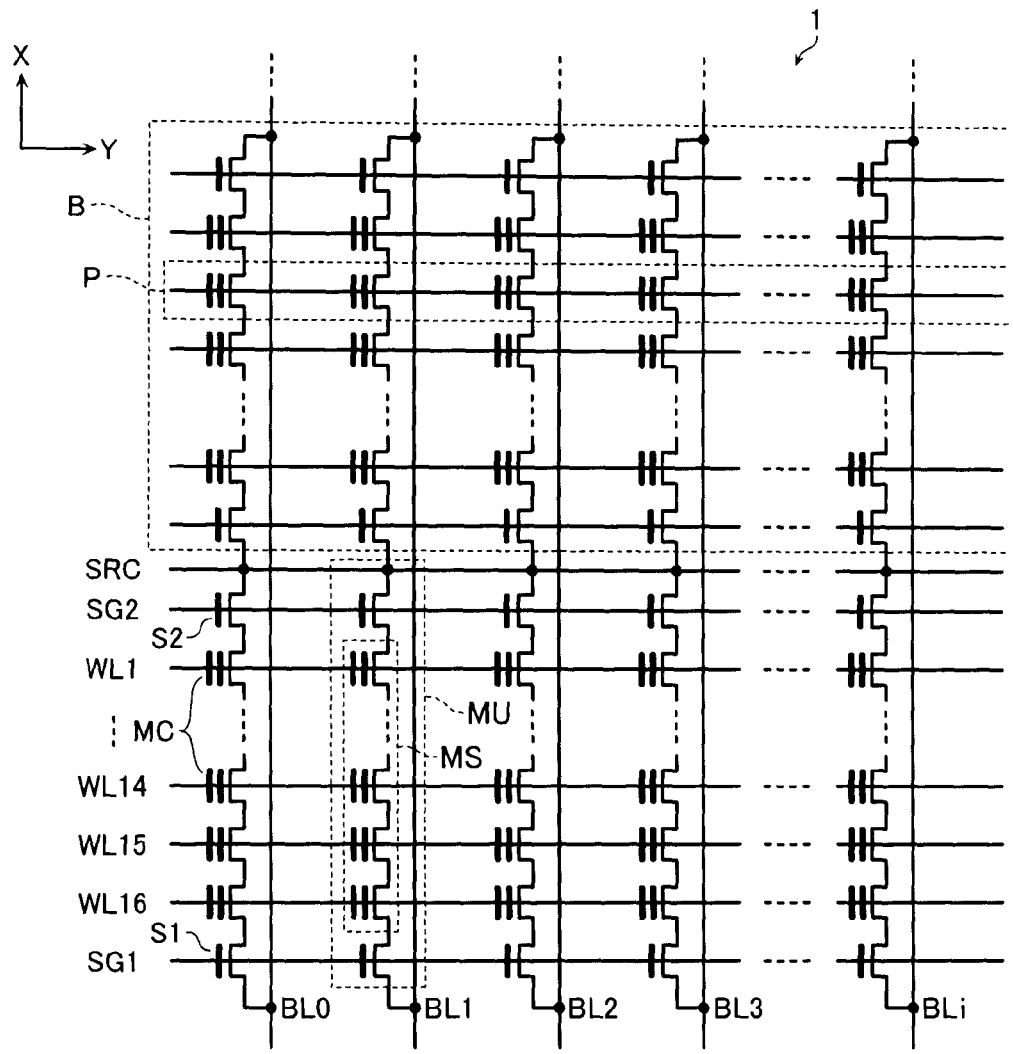
FIG. 2 is a circuit diagram illustrating the configuration of a memory cell array 1 illustrated in FIG. 1.

FIG. 2 illustrates the configuration of the memory cell array 1 illustrated in FIG. 1. As illustrated in FIG. 2, the memory cell array 1 is configured by a plurality of blocks B. In the memory cell array 1, data are erased in a block B basis (a block erase process). As illustrated in FIG. 2, the block B is configured to include a plurality of memory units MU. One memory unit MU is configured by a memory string MS of series-connected, for example, 16 memory cells MC and first and second select gate transistors S1 and S2 connected to both ends of the memory string MS. One end of the first select gate transistor S1 is connected to the bit line BL, and one end of the second select gate transistor S2 is connected to the source line SRC. The control gates of the memory cells MC disposed in a line in the Y direction are commonly connected to any one of the word lines WL1 to WL16. Moreover, the control gates of the first select gate transistors S1 disposed in a line in the Y direction are commonly connected to a select gate line SG1, and the control gates of the second select gate transistors S2 disposed in a line in the Y direction are commonly connected to a select gate line SG2. Furthermore, a set P of the plurality of memory cells MC connected to one word line WL constitutes one page or a plurality of pages. Data are written and read in a set P basis.

[Data Storage Scheme]

Figure 3:
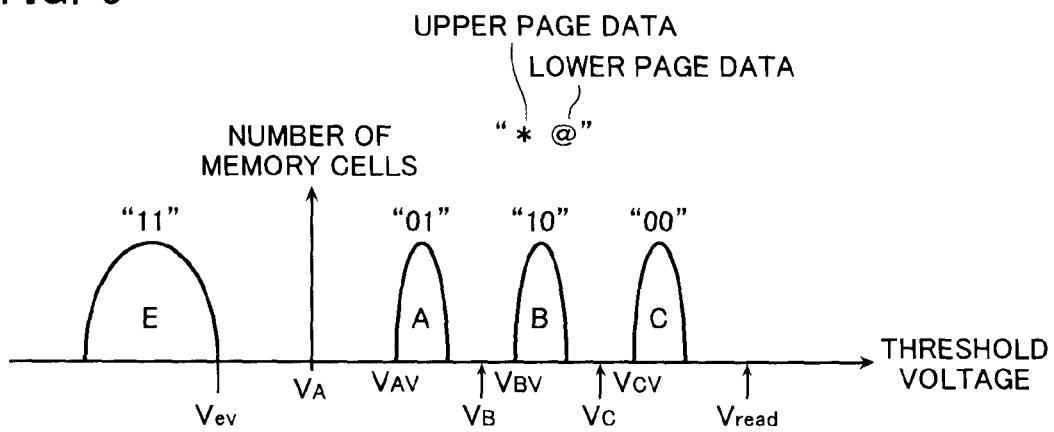
FIG. 3 is a diagram illustrating an example of write data in a 4-value storage flash memory.

The outline of a data storage scheme of a nonvolatile semiconductor memory device will be described. A nonvolatile semiconductor memory device is configured such that the threshold voltage of a memory cell MC can have four kinds of distributions. FIG. 3 illustrates the relation between 2-bit, 4-value data (data "11," "01," "10," and "00") stored in a memory cell MC of a nonvolatile semiconductor memory device and a threshold voltage distribution of the memory cell MC.

In FIG. 3, voltages VA, VB, and VC are read voltages applied to a selected word line WL when reading four data. The voltage VA is a voltage substantially intermediate between the upper limit of a threshold voltage distribution E and the lower limit of a threshold voltage distribution A and is the lowest voltage among the voltages VA, VB, and VC. The voltage VB is higher than the voltage VA and is a voltage substantially intermediate between the upper limit of the threshold voltage distribution A and the lower limit of the threshold voltage distribution B. The voltage VC is higher than the voltage VB and is a voltage substantially intermediate between the upper limit of the threshold voltage distribution B and the lower limit of a threshold voltage distribution C. Moreover, voltages VAV, VBV, and VCV are verify voltages applied to verify whether a write operation is completed when writing data to the respective threshold voltage distributions A, B, and C, respectively. The voltages VAV, VBV, and VCV are set to the lower limits of the threshold voltage distributions A, B, and C, respectively. Moreover, a voltage Vread represents a read pass voltage. The voltage Vread is applied to a non-selected memory cell MC in the memory string MS when reading data and makes the non-selected memory cell MC conductive regardless of data held therein. Furthermore, a voltage Vev is an erase verify voltage applied to a memory cell MC in order to verify whether an erase operation is completed when erasing the data of the memory cell MC. The above respective voltages have a magnitude relation of Vev<VA<VAV<VB<VBV<VC<VCV<Vread.

After a block erase operation is performed, even the upper limit of the threshold voltage distribution E of a memory cell MC has a negative value, and data "11" is assigned thereto. Moreover, memory cells MC exhibiting written-state data "01," "10," and "00" respectively have positive threshold voltage distributions A, B, and C (that is, even the lower limits of the distributions A, B, and C have positive values). The threshold voltage distribution A having the data "01" has the lowest voltage, the threshold voltage distribution C having the data "00" has the highest voltage, and the threshold voltage distribution B having the data "10" has a voltage intermediate between those of the threshold voltage distributions A and C. As illustrated in FIG. 3, the 2-bit data of one memory cell MC includes lower page data and upper page data. When data is expressed by "*@," "*" represents upper page data, and "@" represents lower page data.

[Read Operation]

Figure 4:
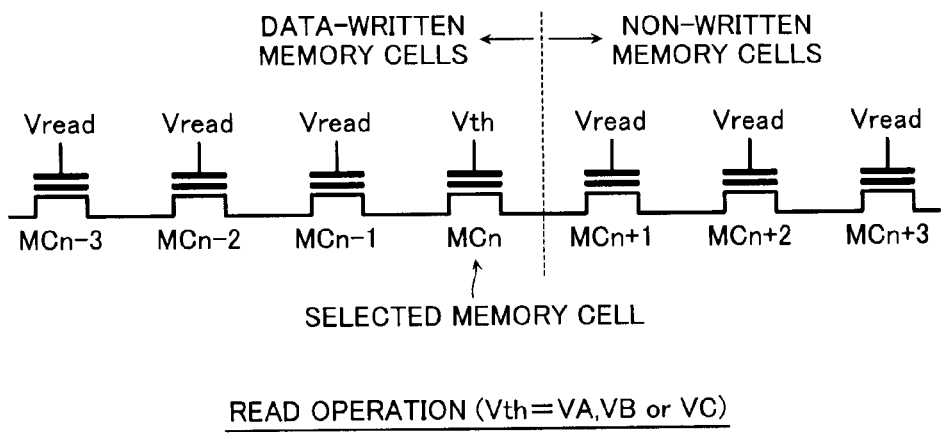
FIG. 4 is a diagram illustrating a voltage during a read operation according to a comparative example.

First, a data read operation in a comparative example and the problem thereof will be described. FIG. 4 illustrates a state of voltages applied to word lines WL during a read operation of the comparative example. FIG. 4 illustrates a case where a data write operation is executed up to the midway of a memory string MS.

A data write operation has been already executed in memory cells MCn−3 to MCn (and memory cells MC1 to MCn−4 (not illustrated)) illustrated in FIG. 4. In this case, the memory cells MCn−3 to MCn have such threshold voltages as to belong to any one of the threshold voltage distributions E, A, B, and C illustrated in FIG. 3, respectively. Moreover, a data write operation has not been executed yet in memory cells MCn+1 to MCn+3 (and memory cells MCn+4 to MC16 (not illustrated)) illustrated in FIG. 4. In this case, all of the memory cells MCn+1 to MCn+3 have such threshold voltages as to belong to the threshold voltage distribution E illustrated in FIG. 3.

In the data read operation of the comparative example, any one of the voltages VA, VB, and VC between the plurality of threshold voltage distributions E, A, B, and C is applied to the control gate electrode (the word line WLn) of a selected memory cell MCn in the memory string MS. Moreover, the read pass voltage Vread (for example, about 6 V to 7 V) is applied to the word lines WL to which the non-selected memory cells MC are connected. In addition, the read pass voltage Vread is a voltage at which the non-selected memory cells MC become conductive regardless of the data held in the non-selected memory cells MC.

As described above, the read voltage VA, VB, or VC is applied to the selected word line WLn, and the read pass voltage Vread is applied to the non-selected word lines WL. In this state, a sense amplifier in the bit line control circuit 2 determines whether an electric current flows through the memory string MS. By determining whether an electric current flows through the memory string MS when the read voltage applied to the selected word line WLn is any one of the voltages VA, VB, and VC, the data of the selected memory cell MCn are read.

Figure 5:
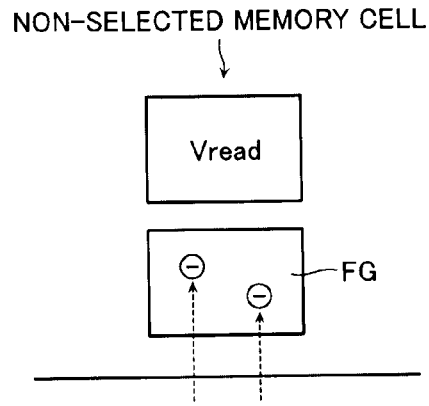
FIG. 5 is a diagram illustrating an erroneous write during a data read operation.

Hereinabove, the read operation in a NAND flash memory of the comparative example is described. However, in such a read operation of the NAND flash memory of the comparative example, an erroneous write may occur. As illustrated in FIG. 5, when the read pass voltage Vread is applied to a non-selected memory cell MC, electrons may be injected into the floating gate electrode FG of the non-selected memory cell MC due to the influence of the read pass voltage Vread. When electrons are injected into the floating gate electrode FG, the electrons affect the threshold voltage representing the data of the non-selected memory cell MC.

This influence appears as change in a threshold voltage distribution. In particular, when a multi-value storage scheme is employed, the width of the threshold voltage distribution and interval between the threshold voltage distributions are set to be narrower than those in a 2-value storage scheme. Thus, the change in the threshold voltage distribution has a significant influence on the reliability of data. In particular, when the read pass voltage Vread is applied to a memory cell MC to which no data is written and which belongs to the threshold voltage distribution E, the threshold voltage thereof is changed. After that, when a write operation is executed to the memory cell MC, the threshold voltage thereof changes greatly. Thus, it is necessary to execute a read operation capable of suppressing the change in the threshold voltage of the non-selected memory cell MC to which data is not written.

In order to suppress the change in the threshold voltage distribution, the nonvolatile semiconductor memory device of the present embodiment executes a read operation as described below.

[Operation of Nonvolatile Semiconductor Memory Device According to First Embodiment]

Figure 6:
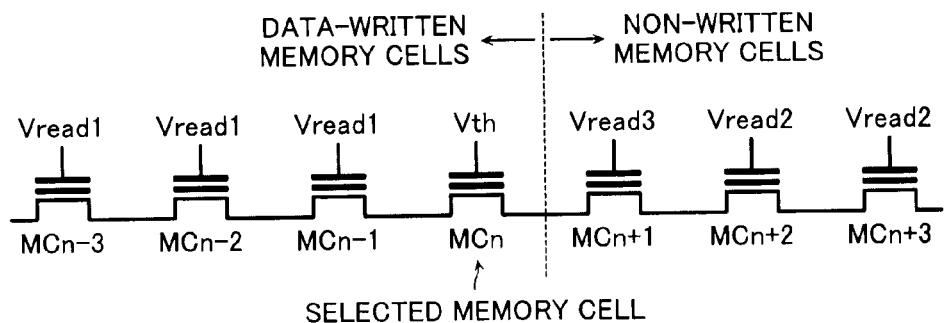
FIG. 6 is a diagram illustrating a voltage during a read operation according to a first embodiment.
Figure 7:
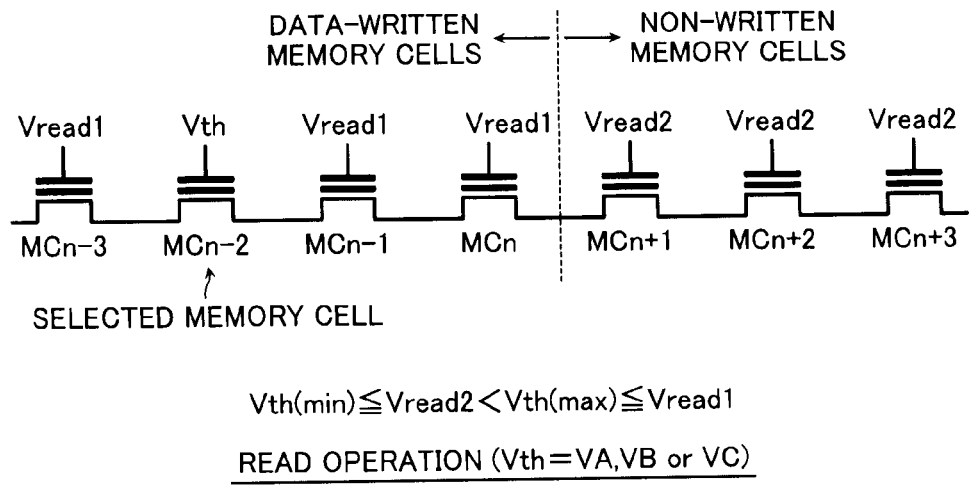
FIG. 7 is a diagram illustrating a voltage during a read operation according to the first embodiment.

FIGS. 6 and 7 illustrate a state of voltages applied to word lines WL during a read operation of the first embodiment. In the present embodiment, it is assumed that 4-value data as illustrated in FIG. 3 are stored in the memory cell MC. Moreover, FIGS. 6 and 7 illustrate also a case where a data write operation is executed up to the midway of the memory string MS.

A data write operation has been already executed in memory cells MCn−3 to MCn (and memory cells MC1 to MCn−4 (not illustrated)) illustrated in FIGS. 6 and 7. In this case, the memory cells MCn−3 to MCn have such threshold voltages as to belong to any one of the threshold voltage distributions E, A, B, and C illustrated in FIG. 3, respectively.

Moreover, a data write operation has not been executed yet in memory cells MCn+1 to MCn+3 (and memory cells MCn+4 to MC16 (not illustrated)) illustrated in FIGS. 6 and 7. That is, all of the memory cells MCn+1 to MCn+3 have such threshold voltages as to belong to the threshold voltage distribution E of a data erased state illustrated in FIG. 3.

FIG. 6 illustrates a case of reading data from a memory cell MC at the end of memory cells MC in which a data write operation has been already executed. FIG. 7 illustrates a case of reading data from a memory cell MC other than the memory cell MC at the end of the memory cells MC in which a data write operation has been already executed. First, an example of the data read operation illustrated in FIG. 6 and the effects thereof will be described. After that, an example of the data read operation illustrated in FIG. 7 and the effects thereof will be described.

[Case where Selected Memory Cell is at the End of Data-Written Memory Cells MC]

In the example of the read operation illustrated in FIG. 6, a case of reading data from a selected memory cell MCn at the very end of data-written memory cells MC will be described. In this case, a read voltage Vth (Vth=VA, VB, or VC) is applied to a selected word line WLn connected to the selected memory cell MCn.

Moreover, the following voltages are applied to non-selected word lines WL depending on the positions relative to the selected memory cell MCn and the data written state, rather than applying the read pass voltage Vread to all of them. A read pass voltage Vread1 is applied to the word lines WLn−1 to WLn−3 (and word lines WL1 to WLn−4 (not illustrated)) connected to data-written memory cells MC, other than the selected word line WLn. The read pass voltage Vread1 is a voltage at which a non-selected memory cell MC becomes conductive regardless of the data held in the non-selected memory cell MC. The read pass voltage Vread1 is set to a voltage (for example, about 6 V to 7 V) substantially equal to the read pass voltage Vread illustrated in FIG. 3.

A read pass voltage Vread2 is applied to word lines WLn+2 to WLn+3 (and word lines WLn+4 to WL16 (not illustrated)) connected to non-written memory cells MC, excluding the word line WLn+1 adjacent to the selected word line WLn. The read pass voltage Vread2 is set to a voltage equal to or higher than the lowest voltage Vth(min)=VA among the read voltages Vth (Vth=VA, VB, or VC) applied to the selected memory cell MCn. Moreover, the read pass voltage Vread2 is set to a voltage lower than the highest voltage Vth(max)=VC among the read voltages Vth. The read voltage Vth(min) is set to about 0 V, for example. The read voltage Vth(max) is set to about 3 V, for example. Although the read pass voltage Vread2 is set to about 0 V as an example, when the read voltage Vth(min) has a negative value, the read pass voltage Vread2 may be set to a negative value. The read pass voltage Vread2 may be set to Vread2 Vth(min) as long as the read pass voltage Vread2 has a value such that non-written memory cells MC reliably become conductive.

A read pass voltage Vread3 is applied to the word line WLn+1 adjacent to the selected word line WLn among the word lines WL connected to the non-written memory cells MC. The reason for applying the read pass voltage Vread3 to the word line WLn+1 will be described in the following "Effects" section. The read pass voltage Vread3 is set to a voltage equal to or higher than the highest voltage Vth(max)=VC among the read voltages Vth (Vth=VA, VB, or VC) applied to the selected memory cell MCn. Moreover, the read pass voltage Vread3 is set to a voltage equal to or lower than the read pass voltage Vread1 applied to the non-selected memory cells MC. The read pass voltage Vread3 is set to about 5.5 V to 6 V, for example.

The above specific voltage values are one example in the read operation, and the voltage values of the respective voltages applied to the word lines WL may satisfy a magnitude relation of Vth(min)≤Vread2<Vth(max)≤Vread3≤Vread1. In the NAND flash memory of the present embodiment, voltages described above are applied to the word lines WL, and the bit line control circuit 2 determines whether an electric current flows through the memory string MS. Although not illustrated in FIG. 6, a voltage Vsg at which the select gate transistors S1 and S2 become conductive is applied to the select gate lines SG1 and SG2.

[Effects]

In the present embodiment, voltages corresponding to the positions relative to the selected memory cell MCn and the data written state are applied to the non-selected word lines WL, rather than applying the same read pass voltage Vread to all of them. Since the non-written memory cells MC have such a threshold voltage as to belong to the threshold voltage distribution E, when a voltage equal to or higher than the read voltage VA is applied to the word lines WL, the memory cells MC become conductive, and a read operation can be executed properly. Moreover, when a high voltage is applied to the non-written memory cells MC, the threshold voltage may be changed. However, in the read operation of the present embodiment, since the read pass voltage Vread2 is set to be lower than the read voltage VC, the change of the threshold voltage of the non-written memory cells MC can be suppressed. According to the read operation of the present embodiment, the change of the threshold voltage of the non-selected memory cells MC caused by the read pass voltage can be suppressed.

Moreover, the read pass voltage Vread3 is applied to the memory cell MCn+1 among the non-written memory cells MC, adjacent to the selected memory cell MCn. In miniaturized semiconductor memory devices, the voltage of the floating gate electrode FG of the selected memory cell MCn is raised due to the influence of both the read voltage Vth applied to the word line WLn and the voltages applied to the adjacent word lines WLn−1 and WLn+1. In this case, the read voltage Vth is set by taking the influence of the adjacent word lines WLn−1 and WLn+1 into consideration. During the read operation, if an excessively low voltage is applied to a non-selected memory cell MCn+1 adjacent to the selected memory cell MCn, the contribution of the non-selected word line WLn+1 may decrease. As a result, it may become difficult to perform an accurate read operation. In contrast, in the present embodiment, the read pass voltage Vread3 applied to the non-selected word line WLn+1 is set so that Vth(max) ≤Vread3≤Vread1. The influence of the read pass voltage Vread3 on the floating gate electrode FG of the selected memory cell MCn is substantially equal to the influence when the voltage Vread1 is applied. Thus, the read conditions of the present embodiment can be made substantially the same as those when the voltage Vread1 is applied to both adjacent word lines WL. As a result, an accurate read operation can be performed.

[Case where Selected Memory Cell is not at the End of Data-Written Memory Cells MC]

In the example of the read operation illustrated in FIG. 7, a case of reading data from a memory cell MCn−2 that is not at the end of data-written memory cells MC will be described. In this case, a read voltage Vth (Vth=VA, VB, or VC) is applied to a selected word line WLn−2 connected to the selected memory cell MCn−2.

Moreover, the following voltages are applied to non-selected word lines WL depending on the positions relative to the selected memory cell MCn−2 and the data written state. The read pass voltage Vread1 is applied to word lines WLn, WLn−1, and WLn−3 (and word lines WL1 to WLn−4 (not illustrated)) connected to data-written memory cells MC, other than the selected word line WLn−2. The read pass voltage Vread1 is set in a manner similar to the above description.

The read pass voltage Vread2 is applied to word lines WLn+1 to WLn+3 (and word lines WLn+4 to WL16 (not illustrated)) connected to non-written memory cells MC. This case is different from the example illustrated in FIG. 6 in that the read pass voltage Vread2 is also applied to the word line WLn+1 adjacent to the data-written memory cells MC. The reason for applying the read pass voltage Vread2 to the word line WLn+1 will be described in the following "Effects" section. The read pass voltage Vread2 is set in a manner similar to the above description.

In this example, the voltage values of the respective voltages applied to the word lines WL satisfy a magnitude relation of Vth(min)≤Vread2<Vth(max)≤Vread1. In the NAND flash memory of this example, voltages described above are applied to the word lines WL, and the bit line control circuit 2 determines whether an electric current flows through the memory string MS. Although not illustrated in FIG. 7, a voltage Vsg at which the select gate transistors S1 and S2 become conductive is applied to the select gate lines SG1 and SG2.

[Effects]

In this example, since the non-written memory cells MC have such a threshold voltage as to belong to the threshold voltage distribution E, when a voltage equal to or higher than the read voltage VA is applied to the word lines WL, the memory cells MC become conductive, and a read operation can be executed properly. Moreover, since the read pass voltage Vread2 is lower than the read voltage VC, the variation of the threshold voltage of the non-written memory cells MC can be suppressed. According to the read operation of the present embodiment, the variation of the threshold voltage of the non-selected memory cells MC caused by the read pass voltage can be suppressed.

Moreover, the selected memory cell MCn−2 is disposed between two adjacent data-written memory cells MC, and the read pass voltage Vread1 is applied to the word lines WLn−3 and WLn−1. With the read voltage Vth applied to the selected word line WLn−2 and the read pass voltage Vread1 applied to the adjacent word lines WLn−3 and WLn−1, the threshold voltage from the selected memory cell MCn−2 under certain conditions can be read. Moreover, since the memory cell MCn+1 to which the word line WLn+1 is connected is not adjacent to the selected memory cell MCn−2, it is not necessary to take the influence on the read operation, of the voltage applied to the word line WLn+1 into consideration. Therefore, it is only necessary to apply the read pass voltage Vread2, at which the memory cell MCn+1 just become conductive, to the word line WLn+1.

Second Embodiment

Next, a nonvolatile semiconductor memory device according to a second embodiment will be described with reference to FIGS. 8 to 11. The entire configuration of the nonvolatile semiconductor memory device of the present embodiment is the same as that of the first embodiment, and the detailed description thereof will be omitted. Moreover, the portions having the same configurations as the first embodiment will be denoted by the same reference numerals, and redundant description thereof will be omitted.

In the first embodiment, an example in which the voltages of word lines are adjusted when performing the read operation of reading data written to the selected memory cell MC is described. In contrast, in the second embodiment, the voltages of the word lines when performing a write verify operation will be described. The write verify operation is performed after the write operation is executed to the selected memory cell MC in order to verify whether data is accurately written to the selected memory cell MC. Hereinafter, a write operation and the procedure thereof will be described. After that, a write verify operation associated with the write operation will be described.

[Write Operation]

First, a write operation will be described briefly. Prior to the write operation, a bit line BL is pre-charged to a voltage corresponding to write data. Specifically, when data of the threshold voltage distribution A, B, or C is to be written to a selected memory cell MCn, 0 V is applied to the bit line BL from the bit line control circuit 2. On the other hand, when no data is to be written to the selected memory cell MCn, a voltage Vdd is applied to the bit line BL from the bit line control circuit 2. The voltage of the bit line is transferred up to the channel of the selected memory cell MCn connected to the selected word line WLn through the select gate transistor S1 and the non-selected memory cells MC.

During the write operation, a write voltage Vpgm (about 10 V to 25 V) is applied to the selected word line WLn several times. Moreover, a write pass voltage Vpass (about 5 V to 15 V) is applied to the non-selected word lines WL. When the channel of the selected memory cell MCn is at 0 V, charges are injected from the channel of the selected memory cell MCn into the floating gate electrode by the write voltage Vpgm, and the threshold voltage of the selected memory cell MCn is shifted toward the positive side. On the other hand, when the channel of the selected memory cell MCn is raised by the voltage Vdd, even when the write voltage Vpgm is applied to the word line WLn, the channel voltage increases due to capacitance coupling, and no charges are injected into the floating gate electrode. Thus, the threshold voltage distribution of the selected memory cell MCn is not shifted, and no data is written.

Figure 8:
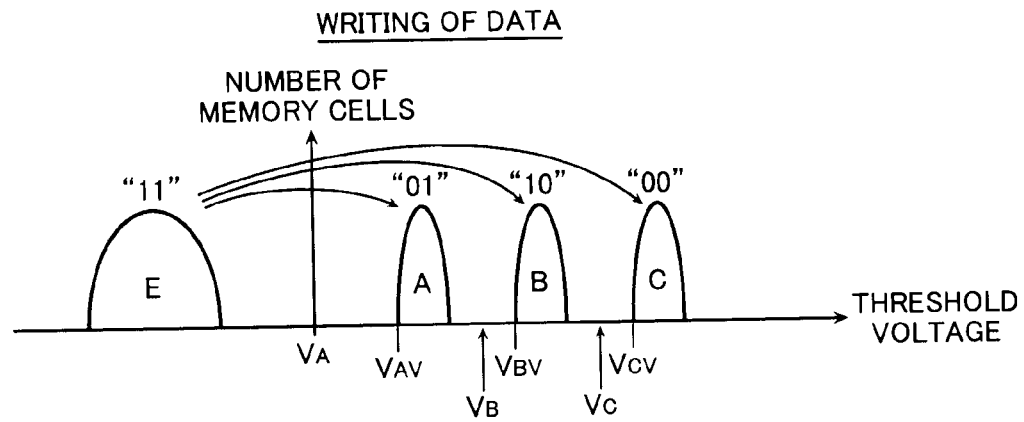
FIG. 8 is a conceptual diagram illustrating a write operation in a 4-value storage flash memory.

In the present embodiment, an example of writing upper page data and lower page data accurately by one writing process will be described. A write operation by one writing process in a 4-value storage scheme will be described with reference to FIG. 8. FIG. 8 is a conceptual diagram illustrating a write operation in a 4-value storage flash memory. As illustrated in FIG. 8, from a state (the threshold voltage distribution E) in which all memory cells MC are erased, the threshold voltage distributions are moved toward the positive direction by using verify voltages VAV, VBV, and VCV equal to the lower limits of a plurality of threshold voltage distributions A, B, and C which is to be obtained finally. In this way, the threshold voltage distributions E, A, B, and C are obtained.

[Procedure of Write Operation]

Figure 9:
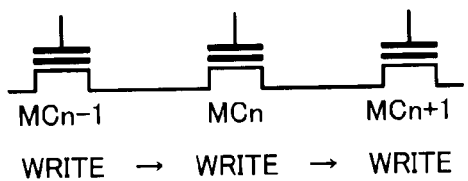
FIG. 9 is a diagram illustrating a write operation in a 4-value storage flash memory.
Figure 10:
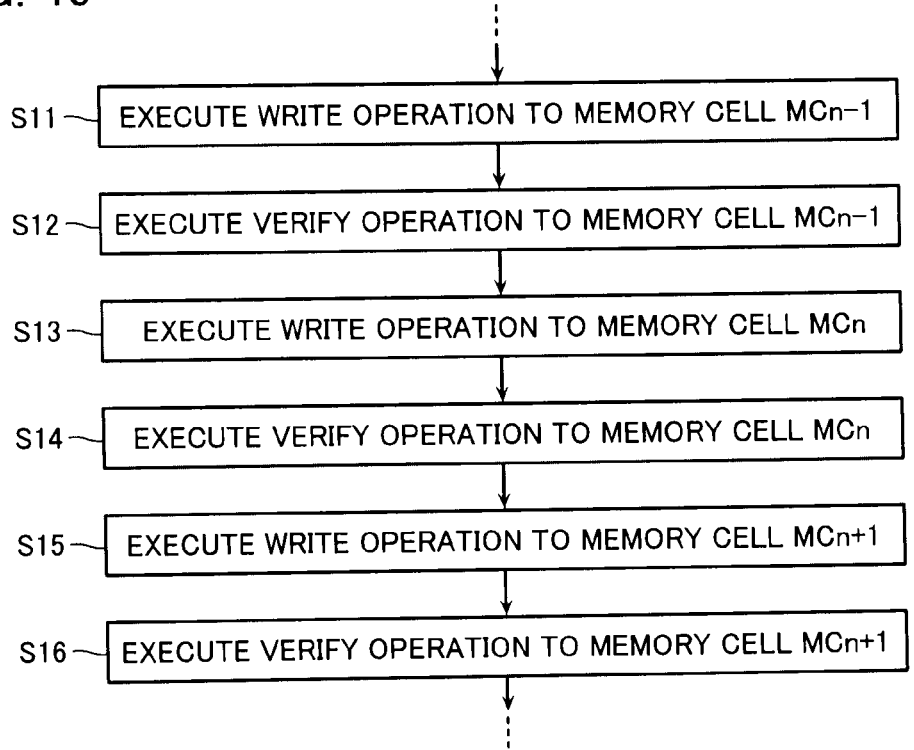
FIG. 10 is a flowchart illustrating a write operation in a 4-value storage flash memory.

A write procedure in which data is written by one writing process will be described with reference to FIGS. 9 and 10. FIG. 9 is a diagram illustrating a write operation in a 4-value storage flash memory. FIG. 10 is a flowchart illustrating a write operation in a 4-value storage flash memory. As illustrated in FIG. 9, the write operation is sequentially executed with respect to the memory cells MC in the memory string MS. First, a write voltage Vpgm is applied to a memory cell MCn−1, and a write operation is executed (step S11 in FIG. 10). After that, a write verify operation is performed so as to determine whether data is accurately written to the memory cell MCn−1 (step S12). When it is determined that data is written to the memory cell MCn−1, the write voltage Vpgm is applied to a memory cell MCn and a write operation is executed (step S13). Although not illustrated in the flowchart of FIG. 10, if certain data is not written to the memory cell MCn−1, the write voltage Vpgm is applied again to the selected memory cell MCn−1.

After that, the write operation and the write verify operation are sequentially executed to the memory cells MCn and MCn+1. Here, when the write verify operation is executed to a certain memory cell (for example, the memory cell MCn), the data write operation has been already executed in the memory cell MCn−1 (and memory cells MC1 to MCn−2 (not illustrated)). In this case, the memory cell MCn−1 has such a threshold voltage as to belong to any one of the threshold voltage distributions E, A, B, and C. On the other hand, the data write operation has not been executed yet in the memory cell MCn+1 (and memory cells MCn+2 to MC16 (not illustrated)). That is, the memory cell MCn+1 has such a threshold voltage as to belong to the threshold voltage distribution E of a data erased state. In the present embodiment, the following write verify operation is executed in such a situation.

[Write Verify Operation]

Figure 11:
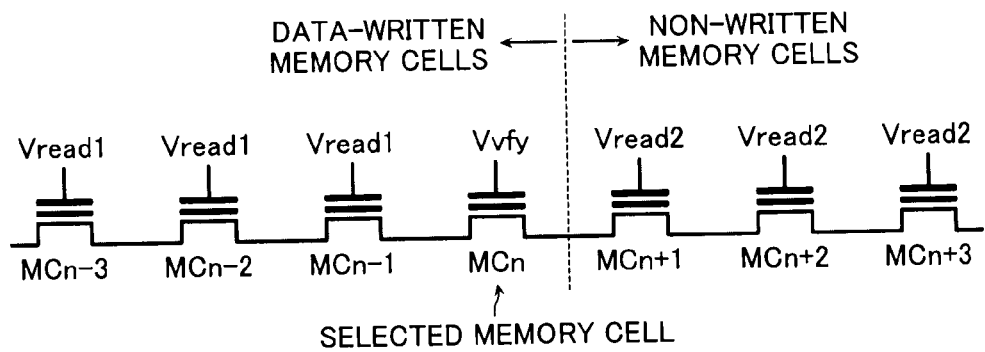
FIG. 11 is a diagram illustrating a voltage during a write verify operation according to a second embodiment.

After the write operation is executed, a write verify operation is executed in order to verify whether the threshold voltage of the selected memory cell MC becomes a voltage equal to or higher than the lower limit of a threshold voltage distribution corresponding to the write data. FIG. 11 illustrates a state of voltages applied to word lines WL during a write verify operation of the second embodiment. As described above, in the present embodiment, a write verify operation in which a data write operation is executed up to the midway of a memory string MS will be described.

The data write operation has been already executed in the memory cells MCn−3 to MCn (and memory cells MC1 to MCn−4 (not illustrated)) illustrated in FIG. 11. In this case, the memory cells MCn−3 to MCn have such threshold voltages as to belong to any one of the threshold voltage distributions E, A, B, and C, respectively. On the other hand, the data write operation has not been executed yet in the memory cells MCn+1 to MCn+3 (and memory cells MCn+4 to MC16 (not illustrated)) illustrated in FIG. 11. That is, all of the memory cells MCn+1 to MCn+3 have such threshold voltages as to belong to the threshold voltage distribution E of a data erased state.

In the write verify operation, a write verify voltage Vvfy (a voltage VAV, VBV, or VCV illustrated in FIG. 8) is applied to the word line WLn to which the selected memory cell MCn is connected. In this case, the bit line control circuit 2 determines whether the selected memory cell MCn is conductive in order to verify data. If certain data is written to the selected memory cell MCn, no electric current will flow through the memory string MS even when the write verify operation described above is executed. On the other hand, when the threshold voltage of the selected memory cell MCn is not reached a certain threshold voltage distribution, electric current will flow through the memory string MS. As illustrated in FIG. 8, the write verify voltage VAV, VBV, or VCV is set to the lower limit of a threshold voltage distribution corresponding to data written to the selected memory cell MCn.

Moreover, the following voltages are applied to non-selected word lines WL depending on the positions relative to the selected memory cell MCn and the data written state. A read pass voltage Vread1 is applied to the word lines WLn−1 to WLn−3 (and word lines WL1 to WLn−4 (not illustrated))

connected to data-written memory cells MC, other than the selected word line WLn. The read pass voltage Vread1 is voltage at which a non-selected memory cell MC becomes conductive regardless of the data held in the non-selected memory cell MC. The read pass voltage Vread1 is set to the same voltage (for example, about 6 V to 7 V) as that of the first embodiment.

A read pass voltage Vread2 is applied to word lines WLn+1 to WLn+3 (and word lines WLn+4 to WL16 (not illustrated)) connected to non-written memory cells MC. The read pass voltage Vread2 is set to a voltage equal to or lower than the lowest voltage Vvfy(min)=VAV among the write verify voltages Vvfy (Vvfy=VAV, VBV, or VCV) applied to the selected memory cell MCn. The read pass voltage Vread2 is set to about 0 V, for example.

The above specific voltage values are one example in the read operation, and the voltage values of the respective voltages applied to the word lines WL may satisfy a magnitude relation of Vread2≤Vvfy(min)<Vvfy(max)≤Vread1. In the NAND flash memory of the present embodiment, voltages described above are applied to the word lines WL, and the bit line control circuit 2 determines whether an electric current flows through the memory string MS. Although not illustrated in FIG. 11, a voltage Vsg at which the select gate transistors S1 and S2 become conductive is applied to the select gate lines SG1 and SG2.

[Effects]

The read pass voltage Vread2 is applied to the non-selected word lines WL of the present embodiment. Since the non-written memory cells MC have such a threshold voltage as to belong to the threshold voltage distribution E, the memory cells MC become conductive even with a voltage equal to or lower than the write verify voltage VAV, and the write verify operation can be executed properly. Moreover, since the read pass voltage Vread2 is equal to or lower than the write verify voltage VAV, the variation of the threshold voltage of the non-written memory cells MC can be suppressed. According to the read operation of the present embodiment, the variation of the threshold voltage of the non-selected memory cells MC caused by the read pass voltage can be suppressed.

Third Embodiment

Next, a nonvolatile semiconductor memory device according to a third embodiment will be described with reference to FIGS. 12 to 16. The entire configuration of the nonvolatile semiconductor memory device of the present embodiment is the same as that of the first embodiment, and the detailed description thereof will be omitted. Moreover, the portions having the same configurations as the first embodiment will be denoted by the same reference numerals, and redundant description thereof will be omitted.

In the second embodiment, the write operation by one writing process and the voltages during the write verify operation associated with the write operation are described. In contrast, in the third embodiment below, the write operation is executed by a two-stage writing process of a lower page write operation and an upper page write operation. The present embodiment is different from the second embodiment in that the voltages during the write verify operation performed after the two-stage write operation are adjusted. Hereinafter, a write operation and the procedure thereof will be described. After that, a write verify operation associated with the write operation will be described.

[Write Operation]

First, a write operation will be described briefly. In the present embodiment, lower page data and upper page data are written to a memory cell MC by different data writing processes, namely two data writing processes.

Figure 12:
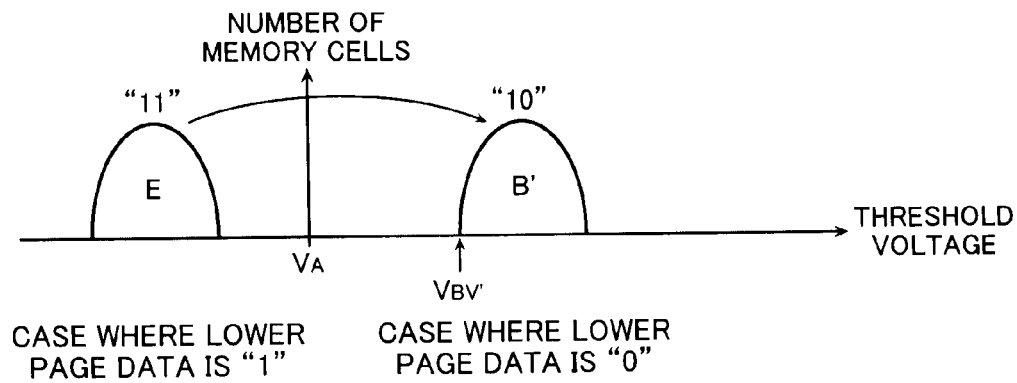
FIG. 12 is a conceptual diagram illustrating a write operation in a 4-value storage flash memory.

First, writing of lower page data will be described with reference to FIG. 12. In FIG. 12, it is assumed that all memory cells MC are included in the threshold voltage distribution E of an erased state, and data "11" is stored. As illustrated in FIG. 12, when performing writing of lower page data, the threshold voltage distribution E of the memory cell MC is divided into two threshold voltage distributions (E and B') depending on the value ("1" or "0") of the lower page data. That is, when the value of the lower page data is "1", the threshold voltage distribution E of the erased state is maintained. On the other hand, when the value of the lower page data is "0", electrons are injected into the floating gate electrode of the memory cell MC so that the threshold voltage of the memory cell MC is increased by a certain amount. As a result, the memory cell MC is changed to a written state (data "10").

Figure 13:
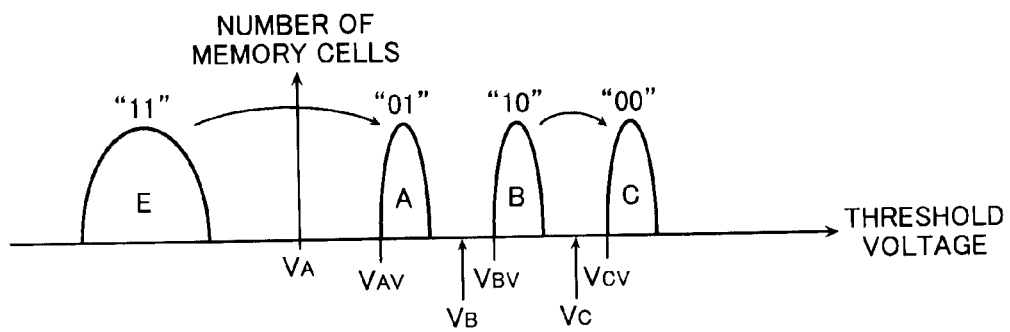
FIG. 13 is a conceptual diagram illustrating a write operation in a 4-value storage flash memory.

Next, writing of upper page data will be described with reference to FIG. 13. As illustrated in FIG. 13, when the value of the upper page data is "1", an increase of the threshold voltage of the memory cell MC is prevented. As a result, the memory cell MC having the data "11" (the threshold voltage distribution E of the erased state) maintains the data "11" as it was, and the memory cell MC having the data "10" (the threshold voltage distribution B') maintains the data "10" as it was. In addition, the lower limit of the threshold voltage distribution B' may be adjusted by using the normal verify voltage VBV higher than the verify voltage VBV'. In this way, the width of the threshold voltage distribution B' may be narrowed to form the threshold voltage distribution B.

On the other hand, when the value of the upper page data is "0", electrons are injected into the floating gate electrode of the memory cell MC so that the threshold voltage of the memory cell MC is increased by a certain amount. As a result, the memory cell MC having the data "11" (the threshold voltage distribution E of the erased sate) is changed to the data "01" of the threshold voltage distribution A, and the memory cell MC having the data "10" is changed to the data "00" of the threshold voltage distribution C. This is the data write operation of the present embodiment.

[Procedure of Write Operation]

Figure 14:
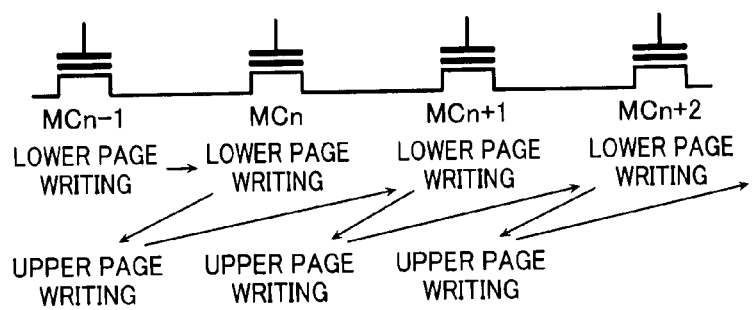
FIG. 14 is a diagram illustrating a write operation in a 4-value storage flash memory.
Figure 15:
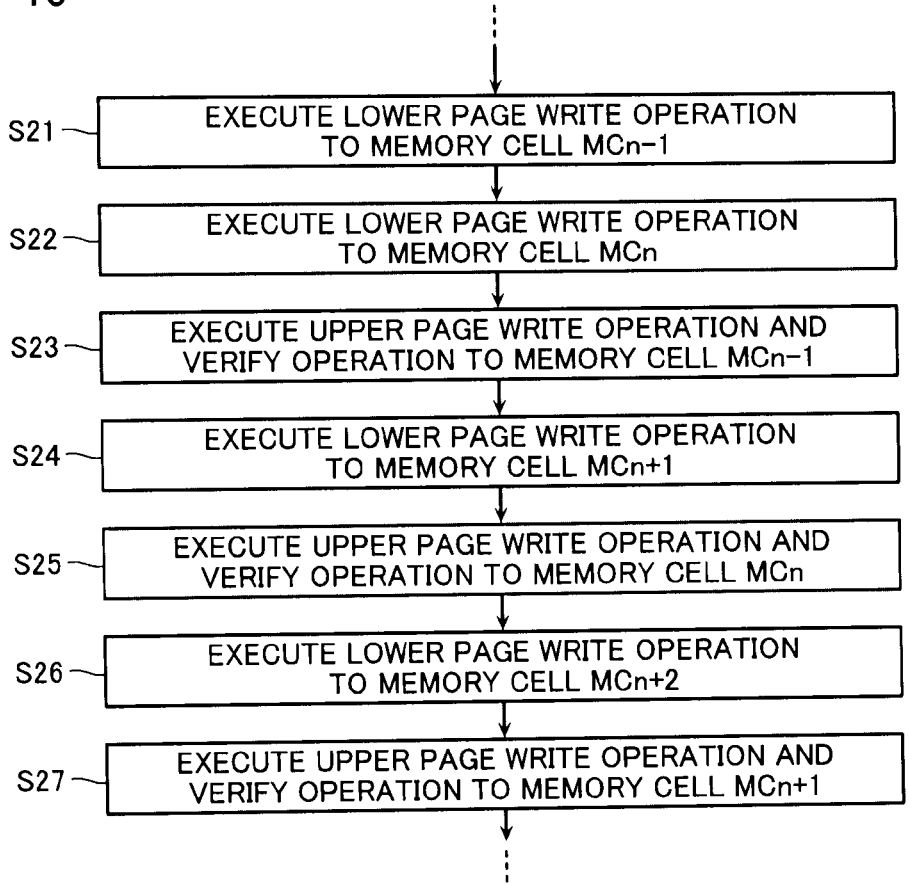
FIG. 15 is a flowchart illustrating a write operation in a 4-value storage flash memory.

A write procedure in which data is written by two writing processes of a lower page write operation and an upper page write operation will be described with reference to FIGS. 14 and 15. FIG. 14 is a diagram illustrating a write operation in a 4-value storage flash memory. FIG. 15 is a flowchart illustrating a write operation in a 4-value storage flash memory. As illustrated in FIG. 14, an upper page write operation on a memory cell MC is executed after a lower page write operation on an adjacent memory cell MC is finished. This is to prevent the threshold voltage of a data-written memory cell MC from being affected during the lower page write operation on the adjacent memory cell MC.

In the write operation, a lower page write operation is executed to a memory cell MCn−1 (step S21 in FIG. 15). Subsequently, the lower page write operation is executed to a memory cell MCn (step S22). Moreover, an upper page write operation is executed to the memory cell MCn−1, and a write verify operation is executed so as to determine whether data is accurately written to the memory cell MCn−1 (step S23). When it is determined that data is written to the memory cell MCn−1, the lower page write operation is executed to a memory cell MCn+1 (step S24). Although not illustrated in the flowchart of FIG. 15, if certain data is not written to the memory cell MCn−1, the upper page write operation is executed again to the selected memory cell MCn−1.

After that, the upper page write operation and the write verify operation are executed to the memory cell MC whose adjacent memory cell MC has finished the lower page write operation. Here, when the write verify operation is executed to a certain memory cell (for example, the memory cell MCn), the data write operation has been already executed in the memory cell MCn−1 (and memory cells MC1 to MCn−2 (not illustrated)). In this case, the memory cell MCn−1 has such a threshold voltage as to belong to any one of the threshold voltage distributions E, A, B, and C. Moreover, the lower page data is written to the memory cell MCn+1. In this case, the memory cell MCn+1 has such a threshold voltage as to belong to any one of the threshold voltage distributions E and B'. The data write operation has not been executed yet in the memory cell MCn+2 (and memory cells MCn+3 to MC16 (not illustrated)). That is, the memory cell MCn+2 has such a threshold voltage as to belong to the threshold voltage distribution E of the data erased state. In the present embodiment, the following write verify operation is executed in such a situation.

[Write Verify Operation]

Figure 16:
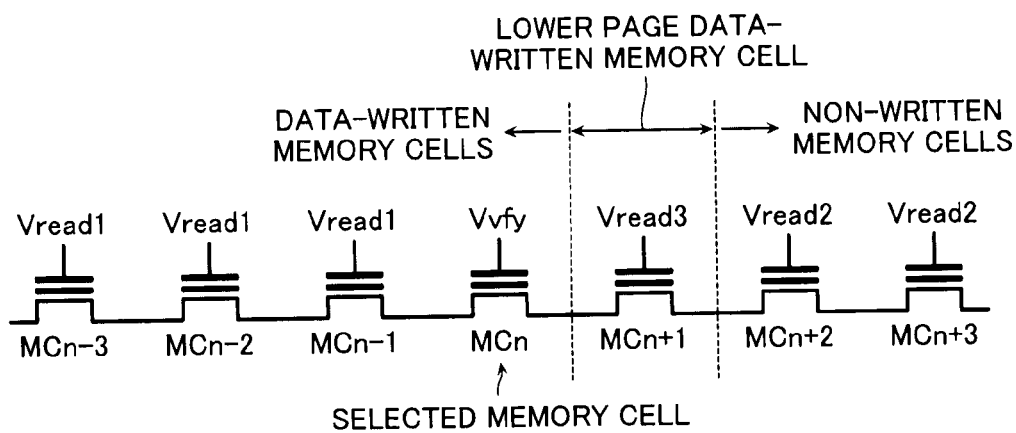
FIG. 16 is a diagram illustrating a voltage during a write verify operation according to a third embodiment.

FIG. 16 illustrates a state of voltages applied to word lines WL during a write verify operation of the third embodiment. As described above, in the present embodiment, a write verify operation in which a data write operation is executed up to the midway of a memory string MS will be described.

The upper page write operation has been already executed in the memory cells MCn−3 to MCn (and memory cells MC1 to MCn−4 (not illustrated)) illustrated in FIG. 16. In this case, the memory cells MCn−3 to MCn have such threshold voltages as to belong to any one of the threshold voltage distributions E, A, B, and C, respectively. The lower page write operation has been already executed in the memory cell MCn+1 illustrated in FIG. 16. In this case, the memory cell MCn+1 has such a threshold voltage as to belong to any one of the threshold voltage distributions E and B'. Moreover, the data write operation has not been executed yet in the memory cells MCn+2 to MCn+3 (and memory cells MCn+4 to MC16 (not illustrated)) illustrated in FIG. 16. That is, all of the memory cells MCn+2 to MCn+3 have such threshold voltages as to belong to the threshold voltage distribution E of the data erased state.

In the write verify operation, a write verify voltage Vvfy (a voltage VAV, VBV, or VCV illustrated in FIG. 13) is applied to the word line WLn to which the selected memory cell MCn is connected. As illustrated in FIG. 13, the write verify voltage VAV, VBV, or VCV is set to the lower limit of a threshold voltage distribution corresponding to the data written to the selected memory cell MCn.

Moreover, the following voltages are applied to non-selected word lines WL depending on the positions relative to the selected memory cell MCn and the data written state. A read pass voltage Vread1 is applied to the word lines WLn−1 to WLn−3 (and word lines WL1 to WLn−4 (not illustrated)) connected to data-written memory cells MC, other than the selected word line WLn. The read pass voltage Vread1 is voltage at which a non-selected memory cell MC becomes conductive regardless of the data held in the non-selected memory cell MC. The read pass voltage Vread1 is set to the same voltage (for example, about 6 V to 7 V) as that of the second embodiment.

A read pass voltage Vread2 is applied to word lines WLn+2 to WLn+3 (and word lines WLn+4 to WL16 (not illustrated)) connected to non-written memory cells MC, excluding the word line WLn+1 adjacent to the selected word line WLn. The read pass voltage Vread2 is set to a voltage equal to or lower than the lowest voltage Vvfy(min)=VAV among the write verify voltages Vvfy (Vvfy=VAV, VBV, or VCV) applied to the selected memory cell MCn. The read pass voltage Vread2 is set to about 0 V, for example.

A read pass voltage Vread3 is applied to the word line WLn+1 adjacent to the selected word line WLn among the word lines WL. The read pass voltage Vread3 is set to a voltage equal to or higher than the highest voltage Vvfy (max)=VCV among the write verify voltages Vvfy (Vvfy=VAV, VBV, or VCV) applied to the selected memory cell MCn. Moreover, the read pass voltage Vread3 is set to a voltage equal to or lower than the read pass voltage Vread1 applied to the non-selected memory cells MC. The read pass voltage Vread3 is set to about 5.5 V to 6 V, for example.

The above specific voltage values are one example in the write verify operation, and the voltage values of the respective voltages applied to the word lines WL may satisfy a magnitude relation of Vread2≤Vvfy(min)<Vvfy(max)≤Vread3≤Vread1. In the NAND flash memory of the present embodiment, voltages described above are applied to the word lines WL, and the bit line control circuit 2 determines whether an electric current flows through the memory string MS. Although not illustrated in FIG. 16, a voltage Vsg at which the select gate transistors S1 and S2 become conductive is applied to the select gate lines SG1 and SG2.

[Effects]

In the present embodiment, the read pass voltage Vread2 is applied to the non-selected word lines WL to which the non-written memory cells MC are connected. Since the non-written memory cells MC have such a threshold voltage as to belong to the threshold voltage distribution E, the memory cells MC become conductive even with a voltage equal to or lower than the write verify voltage VAV, and the write verify operation can be executed properly. Moreover, since the read pass voltage Vread2 is equal to or lower than the write verify voltage VAV, the variation of the threshold voltage of the non-written memory cells MC may be suppressed. According to the write verify operation of the present embodiment, the variation of the threshold voltage of the non-selected memory cells MC caused by the read pass voltage may be suppressed.

In the present embodiment, during the write verify operation, the read pass voltage Vread3 is applied to the non-selected memory cell MCn+1 adjacent to the selected memory cell MCn. The memory cell MCn+1 has such a threshold voltage as to belong to any one of the threshold voltage distributions E and B'. However, by applying a voltage equal to or higher than the write verify voltage Vvfy (max), the memory cell MCn+1 becomes conductive, and the write verify operation can be executed properly.

Fourth Embodiment

Figure 17:
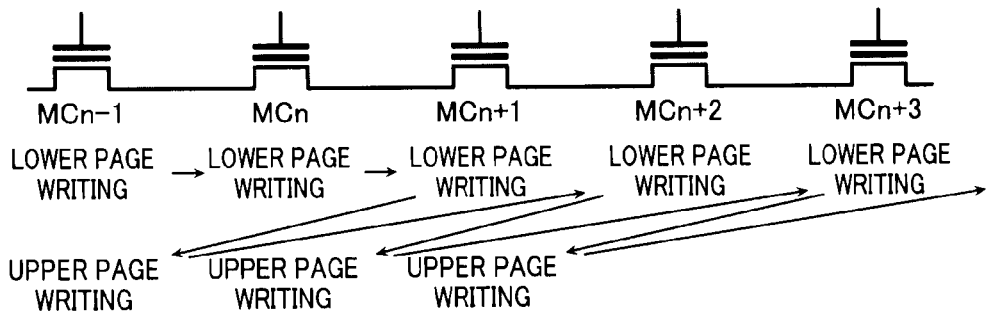
FIG. 17 is a diagram illustrating a write operation in a 4-value storage flash memory.

Next, a nonvolatile semiconductor memory device according to a fourth embodiment will be described with reference to FIGS. 17 to 19. The entire configuration of the nonvolatile semiconductor memory device of the present embodiment is the same as that of the first embodiment, and the detailed description thereof will be omitted. Moreover, the portions having the same configurations as the first embodiment will be denoted by the same reference numerals, and redundant description thereof will be omitted.

In the third embodiment, the write operation by the two-stage writing process of the lower page write operation and the upper page write operation, and the voltages during the write verify operation associated with the write operation are described. The fourth embodiment below is the same as the third embodiment in that the write operation is executed by the two-stage writing process of the lower page write operation and the upper page write operation. However, the present embodiment is different from the third embodiment in that the upper page write operation in a memory cell MCi is executed after the lower page write operation is finished in a memory cell MCi+2 that is farther from the memory cell MCi by two. Hereinafter, a write operation and the procedure thereof will be described. After that, a write verify operation associated with the write operation will be described.

[Procedure of Write Operation]

A write procedure in which data is written by two writing processes of a lower page write operation and an upper page write operation will be described with reference to FIGS. 17 and 18. FIG. 17 is a diagram for describing a write operation in a 4-value storage flash memory. FIG. 18 is a flowchart illustrating a write operation in a 4-value storage flash memory. As illustrated in FIG. 17, the upper page write operation in a memory cell MCi is executed after the lower page write operation the memory cell MCi+2 is finished. This is to further suppress the influence on the threshold voltage of a data-written memory cell MC during the lower page write operation on a memory cell MC than the third embodiment.

Figure 18:
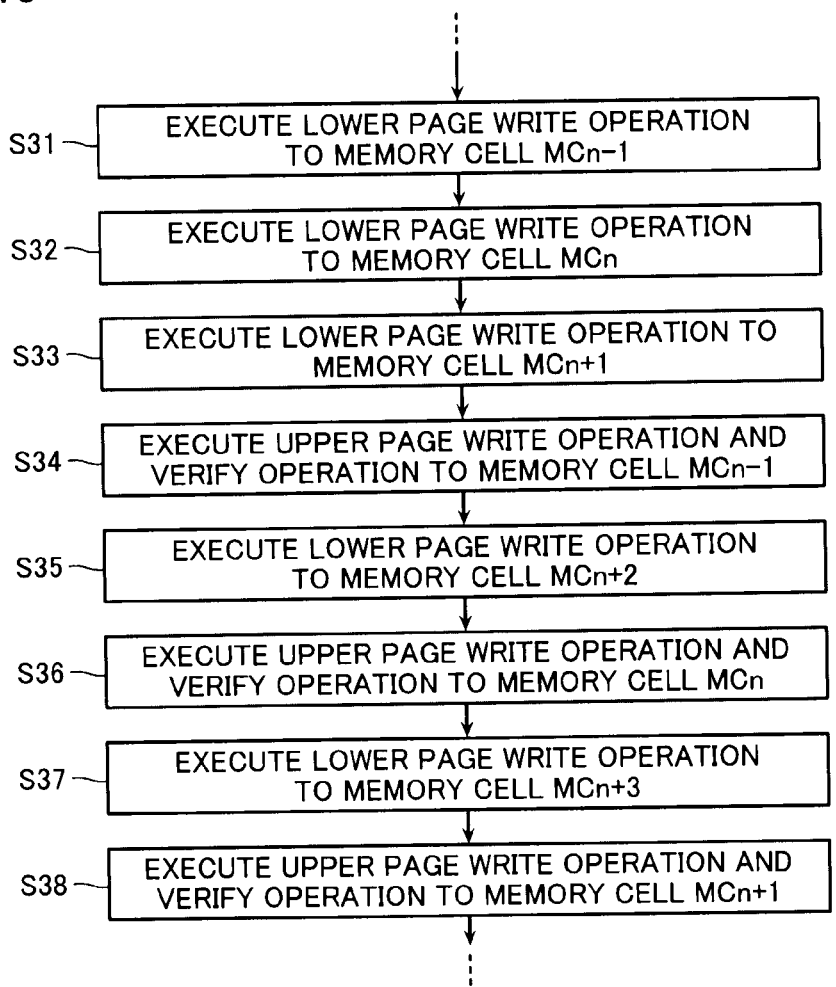
FIG. 18 is a flowchart illustrating a write operation in a 4-value storage flash memory.

In the write operation, a lower page write operation is executed to a memory cell MCn−1 (step S31 in FIG. 18). Subsequently, the lower page write operation is executed to a memory cell MCn (step S32), and the lower page write operation is executed to a memory cell MCn+1 (step S33). Moreover, an upper page write operation is executed with respect to the memory cell MCn−1, and a write verify operation is executed so as to determine whether data is accurately written to the memory cell MCn−1 (step S34). When it is determined that data is written to the memory cell MCn−1, the lower page write operation is executed to a memory cell MCn+2 (step S35). Although not illustrated in the flowchart of FIG. 18, if certain data is not written to the memory cell MCn−1, the upper page write operation is executed again to the selected memory cell MCn−1.

After that, the upper page write operation and the write verify operation are executed to memory cells MCi when the lower page write operation is finished up to the memory cell MCi+2. Here, when the write verify operation is executed to a certain memory cell (for example, the memory cell MCn), the data write operation has been already executed in the memory cell MCn−1 (and memory cells MC1 to MCn−2 (not illustrated)). In this case, the memory cell MCn−1 has such a threshold voltage as to belong to any one of the threshold voltage distributions E, A, B, and C. Moreover, the lower page data is written to the memory cells MCn+1 and MCn+2. In this case, the memory cells MCn+1 and MCn+2 have such threshold voltages as to belong to any one of the threshold voltage distributions E and B'. Moreover, the data write operation has not been executed yet in the memory cell MCn+2 (and memory cells MCn+4 to MC16 (not illustrated)). That is, the memory cell MCn+3 has such a threshold voltage as to belong to the threshold voltage distribution E of the data erased state. In the present embodiment, the following write verify operation is executed in such a situation.

[Write Verify Operation]

Figure 19:
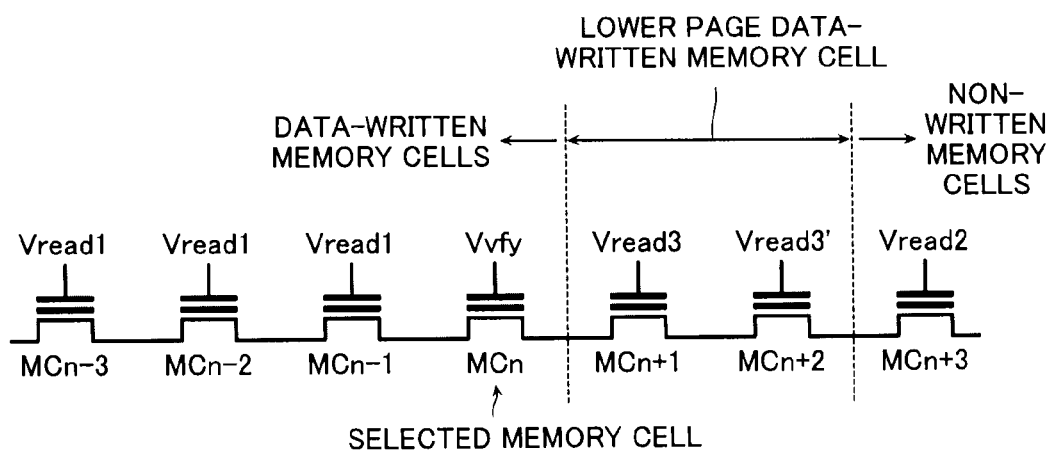
FIG. 19 is a diagram illustrating a voltage during a write verify operation according to a fourth embodiment.

FIG. 19 illustrates a state of voltages applied to word lines WL during a write verify operation of the fourth embodiment. As described above, in the present embodiment, a write verify operation in which a data write operation is executed up to the midway of a memory string MS will be described.

The upper page write operation has been already executed in the memory cells MCn−3 to MCn (and memory cells MC1 to MCn−4 (not illustrated)) illustrated in FIG. 19. In this case, the memory cells MCn−3 to MCn have such threshold voltages as to belong to any one of the threshold voltage distributions E, A, B, and C, respectively. The lower page write operation has been already executed in the memory cells MCn+1 and MCn+2 illustrated in FIG. 16. In this case, the memory cells MCn+1 and MCn+2 has such threshold voltages as to belong to any one of the threshold voltage distributions E and B'. Moreover, the data write operation has not been executed yet in the memory cell MCn+3 (and memory cells MCn+4 to MC16 (not illustrated)) illustrated in FIG. 19. That is, the memory cell MCn+3 have such a threshold voltage as to belong to the threshold voltage distribution E of the data erased state.

In the write verify operation, a write verify voltage Vvfy (a voltage VAV, VBV, or VCV illustrated in FIG. 13) is applied to the word line WLn to which the selected memory cell MCn is connected. As illustrated in FIG. 13, the write verify voltage VAV, VBV, or VCV is set to the lower limit of a threshold voltage distribution corresponding to the data written to the selected memory cell MCn.

Moreover, the following voltages are applied to non-selected word lines WL depending on the positions relative to the selected memory cell MCn and the data written state. A read pass voltage Vread1 is applied to the word lines WLn−1 to WLn−3 (and word lines WL1 to WLn−4 (not illustrated)) connected to data-written memory cells MC, other than the selected word line WLn. The read pass voltage Vread1 is voltage at which a non-selected memory cell MC becomes conductive regardless of the data held in the non-selected memory cell MC. The read pass voltage Vread1 is set to the same voltage (for example, about 6 V to 7 V) as that of the second and third embodiments.

A read pass voltage Vread2 is applied to the word line WLn+3 (and word lines WLn+4 to WL16 (not illustrated)) connected to non-written memory cells MC, excluding the word lines WLn+1 and WLn+2. The read pass voltage Vread2 is set to a voltage equal to or lower than the lowest voltage Vvfy(min)=VAV among the write verify voltages Vvfy (Vvfy=VAV, VBV, or VCV) applied to the selected memory cell MCn. The read pass voltage Vread2 is set to about 0 V, for example.

A read pass voltage Vread3 is applied to the word line WLn+1, and a read pass voltage Vread3' is applied to the word line WLn+2. The read pass voltages Vread3 and Vread3' are set to voltages equal to or higher than the highest voltage Vvfy(max)=VCV among the write verify voltages Vvfy (Vvfy=VAV, VBV, or VCV) applied to the selected memory cell MCn. Moreover, the read pass voltages Vread3 and Vread3' are set to voltages equal to or lower than the read pass voltage Vread1 applied to the non-selected memory cells MC. Furthermore, the read pass voltage Vread3 is set to be equal to or higher than the read pass voltage Vread3'.

The above specific voltage values are one example in the read operation, and the voltage values of the respective voltages applied to the word lines WL may satisfy a magnitude relation of Vread2≤Vvfy(min)<Vvfy(max)≤Vread3'≤Vread3≤Vread1. In the NAND flash memory of the present embodiment, voltages described above are applied to the word lines WL, and the bit line control circuit 2 determines whether an electric current flows through the memory string MS. Although not illustrated in FIG. 19, a voltage Vsg at which the select gate transistors S1 and S2 become conductive is applied to the select gate lines SG1 and SG2.

[Effects]

In the present embodiment, the read pass voltage Vread2 is applied to the non-selected word lines WL to which the non-written memory cells MC are connected. Since the non-written memory cells MC have such a threshold voltage as to belong to the threshold voltage distribution E, the memory cells MC become conductive even with a voltage equal to or lower than the write verify voltage VAV, and the write verify operation can be executed properly. Moreover, since the read pass voltage Vread2 is equal to or lower than the write verify voltage VAV, the change of the threshold voltage of the non-written memory cells MC may be suppressed. According to the read operation of the present embodiment, the change of the threshold voltage of the non-selected memory cells MC caused by the read pass voltage may be suppressed.

In the present embodiment, during the write verify operation, the read pass voltages Vread3 and Vread3' are applied to the non-selected memory cells MCn+1 and MCn+2, respectively. The memory cells MCn+1 and MCn+2 have such threshold voltages as to belong to any one of the threshold voltage distributions E and B'. However, by applying a voltage equal to or higher than the write verify voltage Vvfy (max), the memory cells MCn+1 and MCn+2 become conductive, and the write verify operation can be executed properly.

Fifth Embodiment

Next, a nonvolatile semiconductor memory device according to a fifth embodiment will be described with reference to FIGS. 20 to 22. The entire configuration of the nonvolatile semiconductor memory device of the present embodiment is the same as that of the first embodiment, and the detailed description thereof will be omitted. Moreover, the portions having the same configurations as the first embodiment will be denoted by the same reference numerals, and redundant description thereof will be omitted.

In the first to fourth embodiments, the voltages applied to the word lines WL during the read operation and the voltages applied to the word lines WL during the write verify operation are described. In the fifth embodiment below, the relation between the voltage applied during the read operation and the voltage applied during the write verify operation will be described.

[Read Operation and Write Verify Operation]

Figure 20:
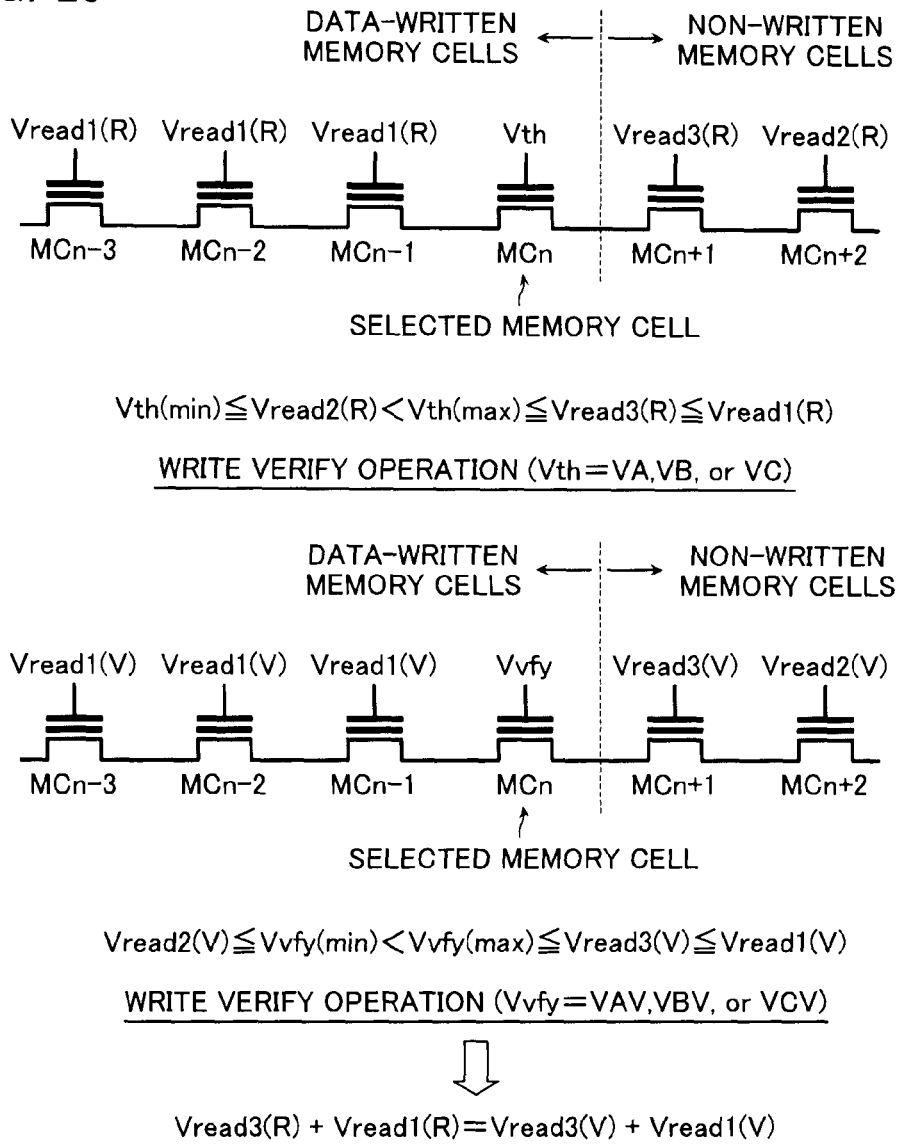
FIG. 20 is a diagram illustrating a voltage during a read operation and a write verify operation according to a fifth embodiment.

FIG. 20 illustrates the state of voltages applied to word lines WL during a read operation and a write verify operation of the fifth embodiment. In the present embodiment, a write verify operation in which a data write operation is executed up to the midway of a memory string MS will be described.

A data write operation has been already executed in memory cells MCn−3 to MCn (and memory cells MC1 to MCn−4 (not illustrated)) illustrated in FIG. 20. In this case, the memory cells MCn−3 to MCn have such threshold voltages as to belong to any one of the threshold voltage distributions E, A, B, and C, respectively. On the other hand, a data write operation has not been executed yet in memory cells MCn+1 to MCn+3 (and memory cells MCn+4 to MC16 (not illustrated)) illustrated in FIG. 20. That is, all of the memory cells MCn+1 to MCn+3 have such threshold voltages as to belong to the threshold voltage distribution E of a data erased state.

In the read operation, a read voltage Vth (Vth=VA, VB, or VC) is applied to the word line WLn to which the selected memory cell MCn is connected. Moreover, the following voltages are applied to the non-selected word lines WL depending on the positions relative to the selected memory cell MCn and the data written state. A read pass voltage Vread1(R) is applied to the word lines WLn−1 to WLn−3 (and word lines WL1 to WLn−4 (not illustrated)) connected to data-written memory cells MC, other than the selected word line WLn. A read pass voltage Vread2(R) is applied to the word line WLn+2 (and word lines WLn+3 to WL16 (not illustrated)) connected to non-written memory cells MC, excluding the word line WLn+1 adjacent to the selected word line WLn. A read pass voltage Vread3(R) is applied to the word line WLn+1 adjacent to the selected word line WLn among the word lines WL connected to the non-written memory cells MC.

The voltage values of the respective voltages applied to the word lines WL satisfy a magnitude relation of Vth(min) ≤Vread2(R)<Vth(max)≤Vread3(R)≤Vread1(R). In the NAND flash memory of the present embodiment, voltages described above are applied to the word lines WL, and the bit line control circuit 2 determines whether an electric current flows through the memory string MS.

Moreover, in the write verify operation, a write verify voltage Vvfy (Vvfy=VAV, VBV, or VCV) is applied to the word line WLn to which the selected memory cell MCn is connected. Moreover, the following voltages are applied to non-selected word lines WL depending on the positions relative to the selected memory cell MCn and the data written state. A read pass voltage Vread1(V) is applied to the word lines WLn−1 to WLn−3 (and word lines WL1 to WLn−4 (not illustrated)) connected to data-written memory cells MC, other than the selected word line WLn. A read pass voltage Vread2(V) is applied to the word lines WLn+2 (and word lines WLn+3 to WL16 (not illustrated)) connected to non-written memory cells MC, excluding the word line WLn+1 adjacent to the selected word line WLn. A read pass voltage Vread3(V) is applied to the word line WLn+1 adjacent to the selected word line WLn among the word lines WL connected to the non-written memory cells MC.

The voltage values of the respective voltages applied to the word lines WL satisfy a magnitude relation of Vread2(V) ≤Vvfy(min)<Vvfy(max)≤Vread3(V)≤Vread1(V). In the NAND flash memory of the present embodiment, voltages described above are applied to the word lines WL, and the bit line control circuit 2 determines whether an electric current flows through the memory string MS.

In the NAND flash memory of the present embodiment, the magnitude relations between the read pass voltages during the read operation and the read pass voltages during the write verify operation are determined as described above. In addition to this, the relations between the read pass voltages during the read operation and the read pass voltages during the write verify operation are set so that Vread3(R)+Vread1 (R)=Vread3(V)+Vread1(V).

[Effects]

In the present embodiment, the read pass voltages Vread2 (R) and Vread2(V) are applied to the non-selected word lines WL connected to the non-written memory cells MC. The non-written memory cells MC have such a threshold voltage as to belong to the threshold voltage distribution E. Thus, the memory cells MC become conductive even with the read pass voltages Vread2(R) and Vread2(V), and the read operation and the write verify operation can be executed properly. Moreover, since the read pass voltages Vread2(R) and Vread2 (V) are lower than the read voltage VC and the write verify voltage VCV, respectively, the change of the threshold voltage of the non-written memory cells MC may be suppressed. According to the read operation of the present embodiment, the change of the threshold voltage of the non-selected memory cells MC caused by the read pass voltage may be suppressed.

Moreover, in miniaturized semiconductor memory devices, the voltage of the floating gate electrode FG of the selected memory cell MCn increases due to the influence of both the read voltage Vth applied to the word line WLn and the voltages applied to the adjacent word lines WLn−1 and WLn+1. Therefore, when the voltages applied to the adjacent word lines WLn−1 and WLn+1 during the write verify operation are greatly different from that during the read operation, the read conditions may change. As a result, it may become difficult to perform an accurate read operation. In contrast, in the present embodiment, the relation between the read pass voltages during the read operation and the read pass voltages during the write verify operation is set so that Vread3(R)+Vread1(R)=Vread3(V)+Vread1(V). As a result, the influence of the read pass voltage during the read operation on the floating gate electrode FG of the selected memory cell MCn is substantially equal to the influence of the read pass voltage during the write verify operation. Thus, in the nonvolatile semiconductor memory device of the present embodiment, the read conditions during the write verify operation can be made substantially the same as those during the read operation.

Alternative Example 1

Figure 21:
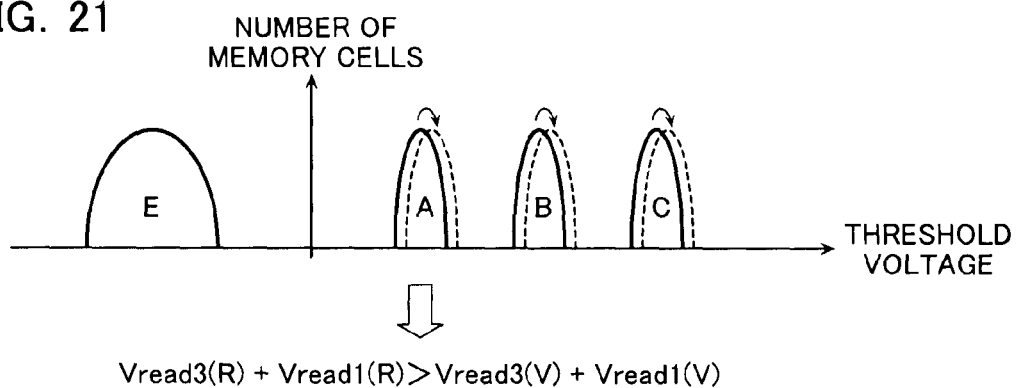
FIG. 21 is a diagram illustrating an operation according to alternative example of the fifth embodiment.

FIG. 21 is a diagram for describing the operation according to an alternative example of the fifth embodiment. In this alternative example, the applied voltages during the read operation and the applied voltages during the write verify operation are in the state illustrated in FIG. 20. In this alternative example, the relation between the read pass voltages Vread3(R) and Vread1(R) during the read operation and the read pass voltages Vread3(V) and Vread1(V) during the write verify operation is different from that of the example illustrated in FIG. 20.

FIG. 21 illustrates an example where a threshold voltage distribution is moved toward the positive direction due to a certain cause after the write operation. Examples of the causes of the movement of the threshold voltage distribution toward the positive direction include an inter-cell interference. The inter-cell interference occurs when a write operation is executed to a memory cell MC adjacent to a certain selected memory cell MC to which a write operation has been already performed. The inter-cell interference varies the threshold voltage distribution of the selected memory cell MC. In this alternative example, when the threshold voltage distribution is moved toward the positive direction, the relation between the read pass voltages during the read operation and the read pass voltages during the write verify operation is set so that Vread3(R)+Vread1(R)>Vread3(V)+Vread1(V).

By setting the sum of the read pass voltages Vread3(R) and Vread1(R) during the read operation to be greater than the sum of the read pass voltages Vread3(V) and Vread1(V) during the write verify operation, the influence on the selected word line WLn of the adjacent word lines WLn−1 and WLn+1 increases. Due to this influence, the voltage value of the selected word line WLn during the read operation becomes higher than a certain value. As a result, even when the threshold voltage distribution is moved toward the positive direction, data can be read accurately.

Alternative Example 2

Figure 22:
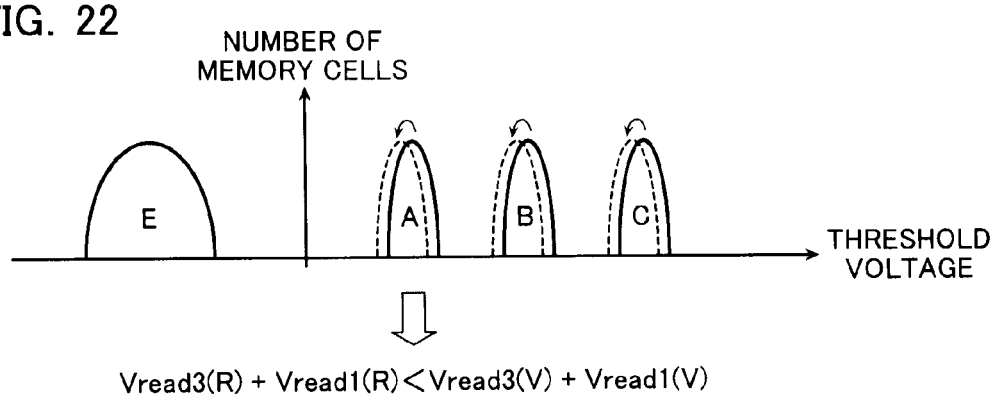
FIG. 22 is a diagram illustrating an operation according to alternative example of the fifth embodiment.

FIG. 22 is a diagram for describing the operation according to an alternative example of the fifth embodiment. In this alternative embodiment, the applied voltages during the read operation and the applied voltages during the write verify operation are in the state illustrated in FIG. 20. In this alternative embodiment, the relation between the read pass voltages Vread3(R) and Vread1(R) during the read operation and the read pass voltages Vread3(V) and Vread1(V) during the write verify operation is different from that of the example illustrated in FIG. 20.

FIG. 22 illustrates an example where a threshold voltage distribution is moved toward the negative direction due to a certain cause after the write operation. Examples of the causes of the movement of the threshold voltage distribution toward the negative direction include a leakage of charges from a floating gate electrode. The leakage of charges occurs after a write operation is performed to a certain selected memory cell MC, and thus decreases the threshold voltage distribution of the selected memory cell MC. In this alternative example, when the threshold voltage distribution is moved toward the negative direction, the relation between the read pass voltages during the read operation and the read pass voltages during the write verify operation is set so that Vread3(R)+Vread1(R)<Vread3(V)+Vread1(V).

By setting the sum of the read pass voltages Vread3(R) and Vread1(R) during the read operation to be smaller than the sum of the read pass voltages Vread3(V) and Vread1(V) during the write verify operation, the influence on the selected word line WLn of the adjacent word lines WLn−1 and WLn+1 decreases. Due to this influence, the voltage value of the selected word line WLn during the read operation becomes lower than a certain value. As a result, even when the threshold voltage distribution is moved toward the negative direction, data can be read accurately.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, in the above embodiments, although a 4-value storage scheme (2-bit/cell) nonvolatile semiconductor device is described, the present invention is not limited to this. The present invention can be naturally applied to a storage scheme using a larger number of bits such as an 8-value storage scheme.

Moreover, in the above embodiments, an example of performing the two-stage writing process of the lower page write operation and the upper page write operation is described. However, as for the write operation, a write scheme of a two-stage writing process by a foggy writing process and a fine writing process may be employed. The foggy writing process is a rough writing of upper page data and lower page data. The fine writing process is an accurate writing of the upper page data and the lower page data.

Figure 23:
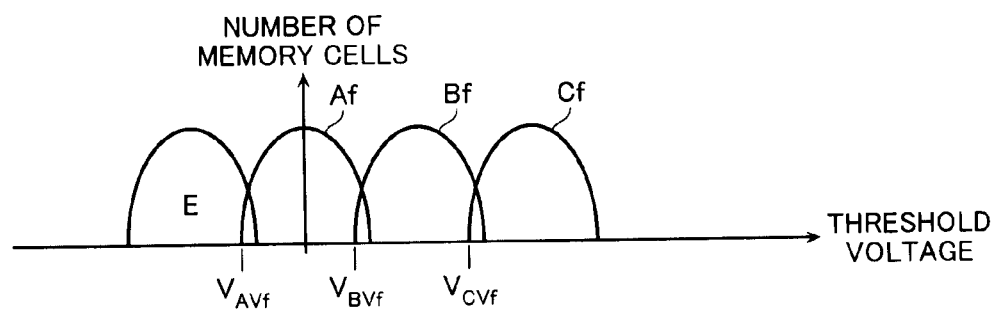
FIG. 23 is a conceptual diagram illustrating a write operation in a 4-value storage flash memory.

A write operation in a 4-value storage scheme including a foggy writing process and a fine writing process will be described with reference to FIGS. 23 and 24. First, as illustrated in FIG. 23, from a state (the threshold voltage distribution E) in which all memory cells MC are erased, a foggy writing process is executed to a certain memory cell MC. The foggy writing process is a writing process of obtaining threshold voltage distributions Af, Bf, and Cf by using verify voltages VAVf, VBVf, and VCVf lower than the lower limits of the respective threshold voltage distributions E, A, B, and C which are to be obtained finally. After the foggy writing process is executed, the threshold voltage distributions become threshold voltage distributions Af, Bf, and Cf which overlap each other.

Figure 24:
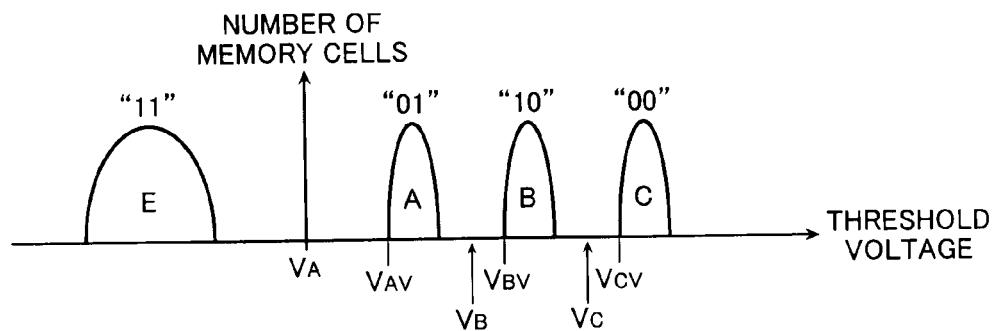
FIG. 24 is a conceptual diagram illustrating a write operation in a 4-value storage flash memory.

After that, as illustrated in FIG. 24, a fine writing process is executed to the memory cell MC. In the fine writing process, the threshold voltage distributions Af, Bf, and Cf are moved toward the positive direction by using the verify voltages VAV, VBV, and VCV equal to the lower limits of a plurality of threshold voltage distributions A, B, and C which is to be obtained finally. In this way, the threshold voltage distributions E, A, B, and C are obtained. The same verify operation as the above embodiments can be employed during the verify operation after the fine writing process is performed.

What is claimed is:

1. A nonvolatile semiconductor memory device comprising:
    a plurality of memory cells configured to hold a threshold voltage included in any one of a plurality of threshold voltage distributions;
    a memory cell array having NAND cell units arranged therein, each of the NAND cell units including a memory string in which the memory cells are connected in series and select transistors connected to both ends of the memory string, respectively;
    word lines connected to the memory cells;
    bit lines connected to a first end of each of the NAND cell units;
    a source line connected to second ends of the NAND cell units; and
    a control circuit configured to control a data read operation, when controlling the data read operation,
    the control circuit applying one of read voltages to a selected word line connected to a selected memory cell, each of the read voltages being set to a voltage between two adjacent threshold voltage distributions,
    the control circuit applying a first read pass voltage to a first non-selected word line connected to one of data-written memory cells, the first read pass voltage being set so that the data-written memory cells become conductive regardless of the kind of the plurality of threshold voltage distributions formed by the data-written memory cells, and
    the control circuit applying a second read pass voltage to a second non-selected word line connected to a non-written memory cell, the second read pass voltage being set so as to be lower than a highest read voltage, the highest read voltage being the highest voltage among the read voltages.

2. The nonvolatile semiconductor memory device according to claim 1,
    wherein the second read pass voltage is set so as to be equal to or higher than a lowest read voltage, the lowest read voltage being the lowest voltage among the read voltages.

3. The nonvolatile semiconductor memory device according to claim 1,
    wherein when the selected memory cell is not at the end of a series of the data-written memory cells, the control circuit applies the second read pass voltage to the second non-selected word lines, and
    wherein when the selected memory cell is at the end of the series of the data-written memory cells, the control circuit applies the second read pass voltage to the second non-selected word line that is not adjacent to the selected word line and applies a third read pass voltage to the second non-selected word line that is adjacent to the selected word line, the third read pass voltage being set so as to be equal to or higher than the highest read voltage and be equal to or lower than the first read pass voltage.

4. The nonvolatile semiconductor memory device according to claim 3,
    wherein the second read pass voltage is set so as to be equal to or higher than a lowest read voltage, the lowest read voltage being the lowest voltage among the read voltages.

5. The nonvolatile semiconductor memory device according to claim 1,
    wherein the control circuit controls a write operation followed by a verify operation, and
    wherein when controlling the verify operation,
    the control circuit applies one of verify voltages to a selected word line connected to the selected memory cell, each of the verify voltages corresponding to the threshold voltage distributions, respectively,
    the control circuit applies the first read pass voltage to a first non-selected word line connected to one of data-written memory cells, and
    the control circuit applies the second read pass voltage to a second non-selected word line connected to a non-written memory cell.

6. The nonvolatile semiconductor memory device according to claim 5,
    wherein the second read pass voltage is set so as to be equal to or lower than a lowest verify voltage, the lowest verify voltage being the lowest voltage among the verify voltages.

7. The nonvolatile semiconductor memory device according to claim 1,
    wherein the control circuit controls a write operation followed by a verify operation, and
    wherein when controlling the verify operation,
    the control circuit applies one of verify voltages to a selected word line connected to the selected memory cell, each of the verify voltages corresponding to the threshold voltage distributions, respectively,
    the control circuit applies the first read pass voltage to a first non-selected word line connected to one of data-written memory cells,
    the control circuit applies the second read pass voltage to a second non-selected word line connected to a non-written memory cell, and
    the control circuit applies a third read pass voltage to a third non-selected word line connected to a memory cell which is adjacent to the selected memory cell and in which data is partially written, the third read pass voltage being set so as to be equal to or higher than the highest read voltage and be equal to or lower than the first read pass voltage.

8. The nonvolatile semiconductor memory device according to claim 7,
    wherein the second read pass voltage is set so as to be equal to or lower than a lowest verify voltage, the lowest verify voltage being the lowest voltage among the verify voltages.

9. The nonvolatile semiconductor memory device according to claim 7,
    wherein the third read pass voltage is set so as to be equal to or higher than a highest verify voltage, the highest verify voltage being the highest voltage among the verify voltages.

10. The nonvolatile semiconductor memory device according to claim 1,
    wherein the control circuit controls a write operation followed by a verify operation, and
    wherein when controlling the verify operation, the control circuit applies one of verify voltages to a selected word line connected to the selected memory cell, each of the verify voltages corresponding to the threshold voltage distributions, respectively, the control circuit applies the first read pass voltage to a first non-selected word line connected to one of data-written memory cells, the control circuit applies the second read pass voltage to a second non-selected word line connected to a non-written memory cell, the control circuit applies a third read pass voltage to a third non-selected word line connected to a memory cell which is adjacent to the selected memory cell and in which data is partially written, the third read pass voltage being set so as to be equal to or higher than the highest read voltage and be equal to or lower than the first read pass voltage, and the control circuit applies a fourth read pass voltage to a fourth non-selected word line connected to a memory cell which is not adjacent to the selected memory cell and in which data is partially written, the fourth read pass voltage being set so as to be equal to or higher than the highest read voltage and be equal to or lower than the third read pass voltage.

11. The nonvolatile semiconductor memory device according to claim 10, wherein the second read pass voltage is set so as to be equal to or lower than a lowest verify voltage, the lowest verify voltage being the lowest voltage among the verify voltages.

12. The nonvolatile semiconductor memory device according to claim 10, wherein the third read pass voltage and the fourth read pass voltage are set so as to be equal to or higher than a highest verify voltage, the highest verify voltage being the highest voltage among the verify voltages.

13. A nonvolatile semiconductor memory device comprising:

a plurality of memory cells configured to hold a threshold voltage included in any one of a plurality of threshold voltage distributions;

a memory cell array having NAND cell units arranged therein, each of the NAND cell units including a memory string in which the memory cells are connected in series and select transistors connected to both ends of the memory string, respectively;

word lines connected to the memory cells;

bit lines connected to a first end of each of the NAND cell units;

a source line connected to second ends of the NAND cell units; and a control circuit configured to control a write operation followed by a verify operation, when controlling the verify operation, the control circuit applying one of verify voltages to a selected word line connected to the selected memory cell, each of the verify voltages corresponding to the threshold voltage distributions, respectively, the control circuit applying a first read pass voltage to a first non-selected word line connected to one of data-written memory cells, the first read pass voltage being set so that the data-written memory cells become conductive regardless of the kind of the plurality of threshold voltage distributions formed by the data-written memory cells, and the control circuit applying a second read pass voltage to a second non-selected word line connected to a non-written memory cell, the second read pass voltage being set so as to be equal to or lower than a lowest verify voltage, the lowest verify voltage being the lowest voltage among the verify voltages.

14. The nonvolatile semiconductor memory device according to claim 13, wherein the control circuit applies a third read pass voltage to a third non-selected word line connected to a memory cell which is adjacent to the selected memory cell and in which data is partially written, the third read pass voltage being set so as to be equal to or higher than a highest verify voltage and be equal to or lower than the first read pass voltage, the highest verify voltage being the highest voltage among the verify voltages.

15. The nonvolatile semiconductor memory device according to claim 13, wherein the control circuit applies a third read pass voltage to a third non-selected word line connected to a memory cell which is adjacent to the selected memory cell and in which data is partially written, the third read pass voltage being set so as to be equal to or higher than a highest verify voltage and be equal to or lower than the first read pass voltage, the highest verify voltage being the highest voltage among the verify voltages, and the control circuit applies a fourth read pass voltage to a fourth non-selected word line connected to a memory cell which is not adjacent to the selected memory cell and in which data is partially written, the fourth read pass voltage being set so as to be equal to or higher than the highest verify voltage and be equal to or lower than the third read pass voltage.

16. The nonvolatile semiconductor memory device according to claim 13, wherein the number of threshold voltage distributions are four, and wherein the control circuit executes the write operation by a two-stage writing process, and executes the verify operation to the memory cells in which the two-stage writing process is finished.

17. A nonvolatile semiconductor memory device comprising:

a plurality of memory cells configured to hold a threshold voltage included in any one of a plurality of threshold voltage distributions;

a memory cell array having NAND cell units arranged therein, each of the NAND cell units including a memory string in which the memory cells are connected in series and select transistors connected to both ends of the memory string, respectively;

word lines connected to the memory cells;

bit lines connected to a first end of each of the NAND cell units;

a source line connected to second ends of the NAND cell units; and a control circuit configured to control a data read operation, a write operation and a verify operation, when controlling the data read operation, the control circuit applying one of read voltages to a selected word line connected to a selected memory cell, each of the read voltages being set to a voltage between two adjacent threshold voltage distributions, the control circuit applying a first read pass voltage to a first non-selected word line connected to one of data-written memory cells, the first read pass voltage being set so that the data-written memory cells become conductive regardless of the kind of the plurality of threshold voltage distributions formed by the data-written memory cells, the control circuit applying a second read pass voltage to a second non-selected word line connected to a non-written memory cell that is not adjacent to the selected memory cell, the second read pass voltage being set so as to be lower than a highest read voltage, the highest read voltage being the highest voltage among the read voltages, the control circuit applying a third read pass voltage to a third non-selected word line connected to a non-written memory cell that is adjacent to the selected memory cell, the third read pass voltage being set so as to be equal to or higher than the highest read voltage and be equal to or lower than the first read pass voltage, when controlling the verify operation, the control circuit applying one of verify voltages to the selected word line, each of the verify voltages corresponding to threshold voltage distributions, respectively, the control circuit applying a first verify read pass voltage to the first non-selected word line, the first verify read pass voltage being set so that the data-written memory cells become conductive regardless of the kind of the plurality of threshold voltage distributions formed by the data-written memory cells, the control circuit applying a second verify read pass voltage to the second non-selected word line, the second verify read pass voltage being set so as to be lower than a highest verify voltage, the highest verify voltage being the highest voltage among the verify voltages, the control circuit applying a third verify read pass voltage to the third non-selected word line, the third verify read pass voltage being set so as to be equal to or higher than the highest verify voltage and be equal to or lower than the first verify read pass voltage, and the control circuit being configured to be capable of changing a magnitude relation between the sum of the first and third read pass voltages and the sum of the first and third verify read pass voltages.

18. The nonvolatile semiconductor memory device according to claim 17, wherein the sum of the first and third read pass voltages is the same as the sum of the first and third verify read pass voltages.

19. The nonvolatile semiconductor memory device according to claim 17, wherein the sum of the first and third read pass voltages is greater than the sum of the first and third verify read pass voltages.

20. The nonvolatile semiconductor memory device according to claim 17, wherein the sum of the first and third read pass voltages is smaller than the sum of the first and third verify read pass voltages.

* * * * *